(12) United States Patent
Inaba

(10) Patent No.: US 9,466,542 B2
(45) Date of Patent: Oct. 11, 2016

(54) SEMICONDUCTOR DEVICE

(71) Applicant: FUJI ELECTRIC CO., LTD., Kawasaki-shi, Kanagawa (JP)

(72) Inventor: Tetsuya Inaba, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days.

(21) Appl. No.: 14/844,707

(22) Filed: Sep. 3, 2015

(65) Prior Publication Data

US 2015/0380331 A1    Dec. 31, 2015

Related U.S. Application Data

(63) Continuation of application No. PCT/JP2014/068174, filed on Jul. 8, 2014.

(30) Foreign Application Priority Data

Jul. 31, 2013    (JP) .................................. 2013-159424

(51) Int. Cl.
*H01L 23/02*    (2006.01)
*H01L 23/06*    (2006.01)
(Continued)

(52) U.S. Cl.
CPC ............. *H01L 23/055* (2013.01); *H01L 23/13* (2013.01); *H01L 23/15* (2013.01); *H01L 23/293* (2013.01); *H01L 23/3121* (2013.01);
(Continued)

(58) Field of Classification Search
CPC ............... H01L 23/055; H01L 23/492; H01L 23/3121; H01L 23/293; H01L 23/49838

USPC ....... 257/678, 684, 687, 690, 700–702, 723; 438/10–107, 124–127
See application file for complete search history.

(56) References Cited

U.S. PATENT DOCUMENTS 5,703,397 A    12/1997  Endo et al.
6,844,621 B2*   1/2005  Morozumi .......... H01L 23/3735
                                                  257/700
(Continued)

FOREIGN PATENT DOCUMENTS

JP    H05-243417 A    9/1993
JP    2002-329803 A    11/2002
(Continued)

OTHER PUBLICATIONS

PCT, "International Search Report for International Application No. PCT/JP2014/068174".

*Primary Examiner* — Hsien Ming Lee
(74) *Attorney, Agent, or Firm* — Manabu Kanesaka

(57) ABSTRACT

A semiconductor device includes a semiconductor chip having a front electrode and a rear electrode; a conductive plate having a main surface connected to the rear electrode of the semiconductor chip; an insulating plate fixed to a surface of the conductive plate opposite to the main surface; and a ceramic case having first and second terminals buried therein, a cavity accommodating the semiconductor chip, the conductive plate, and the insulating plate, and an electrode surface opposite to an opening portion of the cavity. The first terminal has one end connected to the front electrode of the semiconductor chip, and another end exposed from the electrode surface. The second terminal has one end connected to the main surface of the conductive plate, and another end exposed from the electrode surface. The ceramic case and the insulating plate form a housing.

12 Claims, 19 Drawing Sheets

(51) Int. Cl.
  *H01L 23/48* (2006.01)
  *H01L 23/34* (2006.01)
  *H01L 21/44* (2006.01)
  *H01L 21/50* (2006.01)
  *H01L 23/055* (2006.01)
  *H01L 25/07* (2006.01)
  *H01L 25/18* (2006.01)
  *H01L 23/13* (2006.01)
  *H01L 23/15* (2006.01)
  *H01L 23/498* (2006.01)
  *H01L 23/538* (2006.01)
  *H01L 23/29* (2006.01)
  *H01L 23/31* (2006.01)
  *H01L 23/492* (2006.01)

(52) U.S. Cl.
  CPC ............ *H01L 23/48* (2013.01); *H01L 23/492* (2013.01); *H01L 23/49822* (2013.01); *H01L 23/49838* (2013.01); *H01L 23/5389* (2013.01); *H01L 25/07* (2013.01); *H01L 25/18* (2013.01); *H01L 2224/32225* (2013.01); *H01L 2224/48091* (2013.01); *H01L 2224/48227* (2013.01); *H01L 2224/73265* (2013.01); *H01L 2924/19107* (2013.01)

(56) References Cited

U.S. PATENT DOCUMENTS

2004/0041256 A1  3/2004  Takehara et al.
2013/0094165 A1  4/2013  Yano et al.

FOREIGN PATENT DOCUMENTS

| JP | 2007-201517 A | 8/2007 |
| JP | 4954356 B1 | 6/2012 |
| WO | 2012/132709 A1 | 10/2012 |

* cited by examiner

SEMICONDUCTOR DEVICE

CROSS-REFERENCES TO RELATED APPLICATIONS

The present application is a Continuation application of PCT International Application No. PCT/JP2014/068174 filed Jul. 8, 2014, and claiming priority from Japanese Application No. 2013-159424 filed Jul. 31, 2013, the disclosure of which is incorporated herein.

TECHNICAL FIELD

The present invention relates to a semiconductor device.

BACKGROUND ART

FIG. 19 is a cross-sectional view illustrating a main portion of a power semiconductor device. Here, a power semiconductor device 1000 is given as an example of a power semiconductor device including a plurality of semiconductor chips (for example, 20 chips). However, in FIG. 19, only one semiconductor chip is illustrated as a representative.

The power semiconductor device 1000 includes an insulating substrate 64, a semiconductor chip 66, a base plate 70, and a case 68.

The insulating substrate 64 is formed by laminating an insulating plate 61, a circuit plate 62, and a metal plate 63. The semiconductor chip 66 is fixed to the circuit plate 62 through a bonding material 65 such as solder. In addition, the semiconductor chip 66 is a power semiconductor chip such as an insulated gate bipolar transistor (IGBT) chip or a diode chip.

An external terminal 69 of the case 68 is connected to the semiconductor chip 66 by a bonding wire 67. The rear surface of the insulating substrate 64 is fixed to the base plate 70 by a bonding material 65. The case 68 is filled with a sealing resin 71, such as gel, and an opening portion of the case 68 is covered with an upper cover 72.

In recent years, a technique has been developed in which an integrated circuit (IC) chip is accommodated in a ceramic case having a cavity to reduce the size of an integrated circuit device. The integrated circuit device includes a ceramic case which has a terminal provided therein and a cavity and an IC chip which is accommodated in the cavity, and is called a cavity package. Since a small amount of current flows to the IC chip, the thickness of the terminal buried in the cavity package is generally in the range of about 10 µm to 20 µm.

Patent Document 1 discloses a structure in which a power semiconductor chip is provided in a step portion of an uneven circuit board and a circuit element is provided on a surface opposite to the step portion.

CITATION LIST

Patent Document

Patent Document 1: Japanese Patent No. 4954356

DISCLOSURE OF THE INVENTION

Problem to be Solved by the Invention

The power semiconductor device 1000 has the following problems.

(1) It is difficult to arrange the external terminal 69 above the semiconductor chip 66, so the external terminal 69 is arranged in an outer circumferential portion of the case 68. As a result, it is difficult to reduce the size of the housing.

(2) Since the sealing resin 71 is generally a gel, it is necessary to separately provide the case 68 or the upper cover 72 in order to maintain the outer shape.

(3) When about 20 semiconductor chips 66 are mounted, about 10 bonding wires 67 are connected to each semiconductor chip 66. Therefore, a considerable number of bonding wires 67 is required, resulting in considerable amount of time consumption for a wiring process.

An example in which not the IC chip but the power semiconductor chip is accommodated in the cavity package has not been found. It is suggested that this is because the terminal needs to have a thickness of 100 µm or more in terms of current capacity in the power semiconductor chip and it is difficult to manufacture the cavity package having the thick terminal buried therein.

Patent Document 1 does not disclose a structure in which the housing of the power semiconductor device is formed only by the circuit board. In addition, Patent Document 1 does not disclose a structure in which the terminal corresponding to the rear electrode of the power semiconductor chip leads to the upper surface of the housing.

The invention has been made in order to solve the above-mentioned problems and an object of the invention is to provide a semiconductor device that is assembled by a small number of processes and has a low manufacturing cost, high reliability, and a small size.

Means for Solving Problem

According to an aspect of the invention, there is provided a semiconductor device including: a semiconductor chip that includes a front electrode and a rear electrode; a conductive plate that has a main surface connected to the rear electrode of the semiconductor chip; an insulating plate that is fixed to a surface of the conductive plate which is opposite to the main surface; and a ceramic case. The ceramic case includes a first terminal and a second terminal which are buried therein; a cavity accommodating the semiconductor chip, the conductive plate, and the insulating plate; and an electrode surface which is opposite to an opening portion of the cavity. The first terminal has one end which is connected to the front electrode of the semiconductor chip and the other end which is exposed from the electrode surface. The second terminal has one end which is connected to the main surface of the conductive plate and the other end which is exposed from the electrode surface. The ceramic case and the insulating plate form a housing.

According to another aspect of the invention, there is provided a semiconductor device including: a semiconductor chip that includes a front electrode and a rear electrode; a wiring substrate that includes a conductive wiring plate which is buried therein, an exposure surface of the wiring plate being connected to the rear electrode of the semiconductor chip; and a ceramic case that includes a first terminal and a second terminal which are buried therein, a cavity in which the semiconductor chip is accommodated, and an electrode surface which is opposite to an opening portion of the cavity. The first terminal has one end which is connected to the front electrode of the semiconductor chip and the other end which is exposed from the electrode surface. The second terminal has one end which is connected to the exposure surface of the wiring plate and the other end which is exposed from the electrode surface. The ceramic case and the wiring substrate form a housing.

According to still another aspect of the invention, there is provided a semiconductor device including: a semiconductor chip that includes a front electrode and a rear electrode; a wiring substrate that includes a conductive wiring plate which is buried therein, an exposure surface of the wiring plate being connected to the rear electrode of the semiconductor chip; and a ceramic case that includes a first terminal and a second terminal which are buried therein, a cavity in which the semiconductor chip is accommodated, and an electrode surface which is opposite to an opening portion of the cavity. The first terminal has one end which is connected to the front electrode of the semiconductor chip and the other end which is exposed from the electrode surface. The second terminal has one end which is connected to the exposure surface of the wiring plate and the other end which protrudes from a surface perpendicular to the electrode surface. The ceramic case and the wiring substrate form a housing.

Effect of the Invention

The invention provides a semiconductor device that is assembled by a small number of processes and has a low manufacturing cost, high reliability, and a small size.

These and other objects, features, and advantages of the invention will be apparent from the following description taken in conjunction with the accompanying drawings illustrating the preferred embodiments of the invention.

BRIEF DESCRIPTION OF DRAWINGS

FIGS. 1(a), 1(b) illustrate the structure of a power semiconductor device according to a first embodiment, wherein FIG. 1(a) is a plan view and FIG. 1(b) is a cross-sectional view taken along the line 1(b)-1(b) of FIG. 1(a);

FIGS. 17(a), 17(b) illustrate a power semiconductor device according to a seventh embodiment, wherein FIG. 17(a) is a plan view, and FIG. 17(b) is a cross-sectional view taken along the line 17(b)-17(b) of FIG. 17(a);

MODE(S) FOR CARRYING OUT THE INVENTION

Hereinafter, embodiments will be described according to the drawings.

The term "electrically and mechanically connected" used in the following description is not limited to a case in which objects are connected to each other by direct bonding and includes a case in which objects are connected to each other through a conductive bonding material such as solder or a sintered metal material.

First Embodiment

Figure 1A:
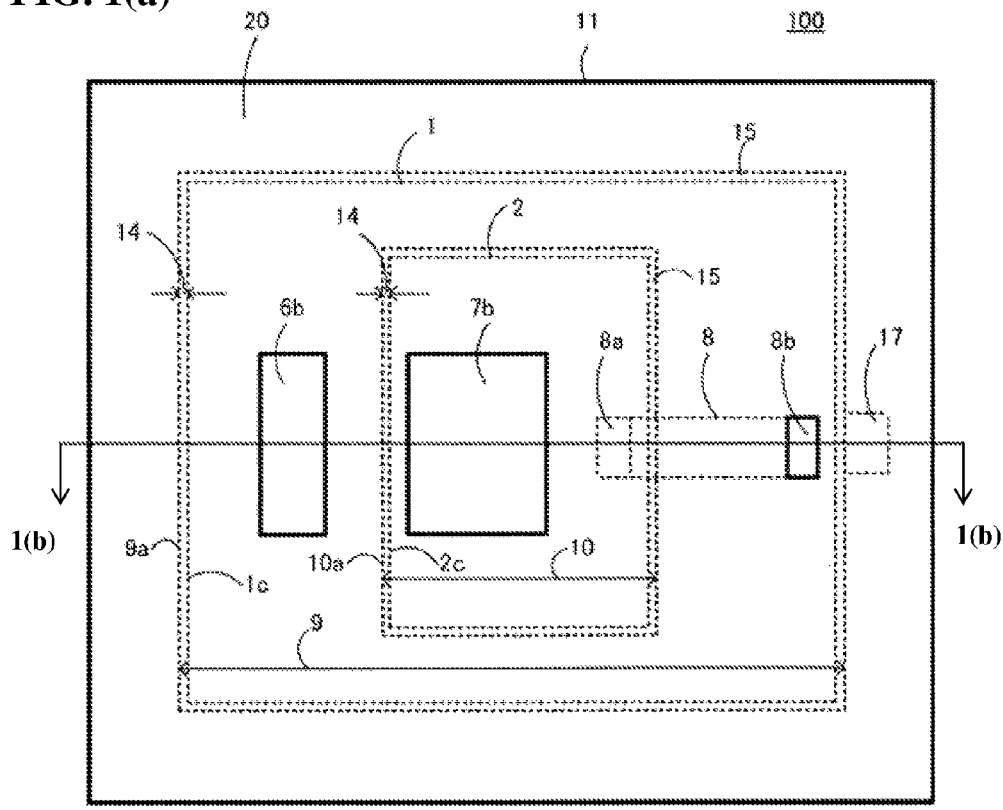
Figure 1B:
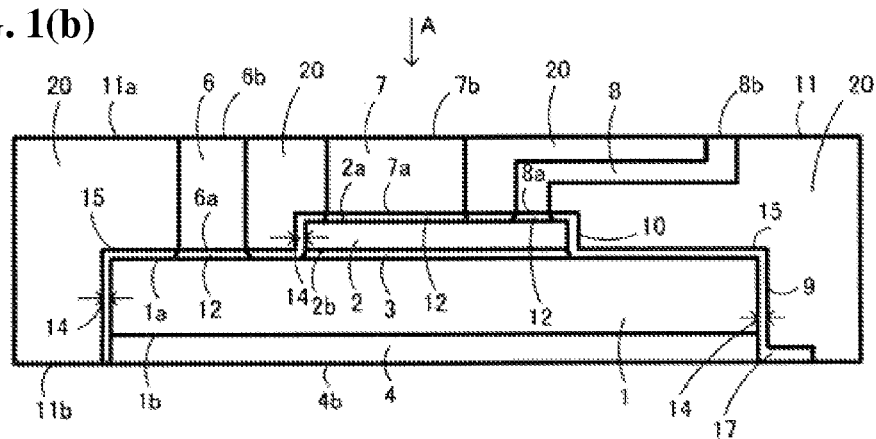

FIGS. 1(a), 1(b) are diagrams illustrating the structure of a power semiconductor device according to a first embodiment. FIG. 1(a) is a plan view and FIG. 1(b) is a cross-sectional view taken along the line 1(b)-1(b) of FIG. 1(a). In addition, FIG. 1(a) is a perspective plan view as viewed from the direction of an arrow A in FIG. 1(b).

A power semiconductor device 100 includes a semiconductor chip 2, a conductive plate 1, an insulating plate 4, and a ceramic case 11. The ceramic case 11 and the insulating plate 4 form a housing. In addition, the power semiconductor device 100 includes a sealing material 15.

The semiconductor chip 2 is a vertical switching element, such as an IGBT or a power metal-oxide-semiconductor field effect transistor (MOSFET), and includes a front electrode 2a and a rear electrode 2b. The rear electrode 2b of the semiconductor chip 2 is electrically and mechanically connected to a main surface 1a of the conductive plate 1 by a conductive bonding material 3 such as solder. The insulating plate 4 is fixed to a surface 1b of the conductive plate 1 opposite to the main surface 1a.

The ceramic case 11 includes a ceramic 20. A second terminal 6 and first terminals 7 and 8 are buried in the ceramic case 11. In addition, the ceramic case 11 includes a first cavity 9 and a second cavity 10 which have a concave shape. An opening portion 10a of the second cavity 10 is smaller than an opening portion 9a of the first cavity 9. The ceramic case 11 has an electrode surface 11a which is opposite to the opening portions 9a and 10a of the first and second cavities 9 and 10.

The conductive plate 1 and the insulating plate 4 are accommodated in the first cavity 9 and the semiconductor chip 2 is accommodated in the second cavity 10. The sealing material 15 is provided in a gap 14 between the cavities.

The gap 14 has a sufficient width to accurately position the target to be accommodated and to accommodate the sealing material 15. When the width of the gap 14 is less than 50 µm, it is difficult for the sealing material 15 to be infiltrated into the gap. Therefore, the width of the gap 14 may be equal to or greater than 50 μm. The width of the gap 14 is preferably in the range of about 0.1 mm to 0.2 mm.

The front electrode 2a of the semiconductor chip 2 accommodated in the second cavity 10 is electrically and mechanically connected to one end (end surfaces 7a and 8a) of each of the first terminals 7 and 8 buried in the ceramic case 11 by a conductive bonding material 12. For example, when the semiconductor chip 2 is an IGBT, the first terminal 7 is connected to an emitter electrode and the first terminal 8 is connected to a gate electrode. In addition, the other ends (end surfaces 7b and 8b) of the first terminals 7 and 8 are exposed from the electrode surface 11a of the ceramic case 11.

The main surface 1a of the conductive plate 1 accommodated in the first cavity 9 is electrically and mechanically connected to one end (end surface 6a) of the second terminal 6 buried in the ceramic case 11 by the conductive bonding material 12. That is, the second terminal 6 is electrically connected to the rear electrode of the semiconductor chip 2 (a collector electrode in the case of an IGBT). In addition, the other end (end surface 6b) of the second terminal 6 is exposed from the electrode surface 11a of the ceramic case 11.

The first terminals 7 and 8 and the second terminal 6 buried in the ceramic case 11 may be arranged in the vertical direction or the horizontal direction. In FIGS. 1(*a*), 1(*b*), one layer of the first terminal 8 is arranged in the horizontal direction. However, multiple layers of the first terminal 8 may be arranged. A portion of the first terminal 8 which is horizontally arranged has a thickness of about several hundreds of micrometers and a width of about several micrometers.

The first terminals 7 and 8 are fixed to the semiconductor chip 2 by the bonding material 12 and the second terminal 6 is fixed to the conductive plate 1 by the bonding material 12. Then, the sealing material 15 is injected into the gap 14 through an inlet 17 provided in the ceramic case 11. The injected sealing material 15 is infiltrated into the entire gap 14 by a capillary phenomenon and covers the semiconductor chip 2 or the conductive plate 1.

The sealing material 15 has a function of sealing, electrically insulating, and protecting the semiconductor chip 2 or the conductive plate 1. In addition, the sealing material 15 has a function of preventing humidity from being infiltrated into the bonding materials 3 and 12 and of preventing the deterioration of the bonding materials 3 and 12. The sealing material 15 also has a function of fixing the ceramic case 11, the semiconductor chip 2, and the conductive plate 1. Therefore, a material which has high electrical insulation and adhesion, high viscosity before hardening, and is likely to be infiltrated into the gap 14 by the capillary phenomenon is selected as the sealing material 15. For example, an epoxy resin is preferable as the sealing material 15.

Protrusions (not illustrated) with a size of about 0.1 mm to 0.2 mm may be provided on the inner wall of the first cavity 9 or the second cavity 10 to ensure the gap 14 such that the semiconductor chip 2 or the conductive plate 1 can be reliably covered with the sealing material 15.

The conductive plate 1 has a function of making a current flow from the rear electrode 2b of the semiconductor chip 2 to the second terminal 6, a function of effectively dissipating heat generated from the semiconductor chip 2 to the outside (for example, a heat dissipation base (not illustrated) through the insulating plate 4, and a function of supporting the semiconductor chip 2. The conductive plate 1 is made of, for example, copper or aluminum. When the conductive plate 1 is a copper plate, nickel plating may be performed to prevent oxidation.

The insulating plate 4 may be made of a material with high electrical insulation and thermal conductivity. For example, a ceramic plate which is made of alumina, silicon nitride, or aluminum nitride and has a thickness of about 0.2 mm is suitable as the insulating plate 4. In addition, an insulating resin, such as polyimide, may be used.

A bottom 11b of the ceramic case 11 is substantially flush with a rear surface 4b of the insulating plate 4. In this case, it is possible to ensure high adhesion between the rear surface 4b of the insulating plate 4 and a base plate provided on the rear surface 4b.

In the power semiconductor device 100 according to this embodiment, the first terminals 7 and 8 and the second terminal 6 are provided in the ceramic case 11 in which the semiconductor chip 2 is accommodated. Therefore, a terminal for connection to the outside can be arranged immediately above the semiconductor chip 2. In addition, since the semiconductor chip 2 and the conductive plate 1 are accommodated in the first cavity 9 and the second cavity 10 of the ceramic case 11, it is possible to reduce the occupation area of the power semiconductor device 100. Furthermore, the first terminals 7 and 8 and the second terminal are buried in the ceramic case 11 and are directly electrically and mechanically connected to the semiconductor chip 2 or the conductive plate 1. Therefore, it is possible to reduce the thickness of the power semiconductor device 100 to about several millimeters. As a result, it is possible to reduce the size of the power semiconductor device 100.

Figure 19:
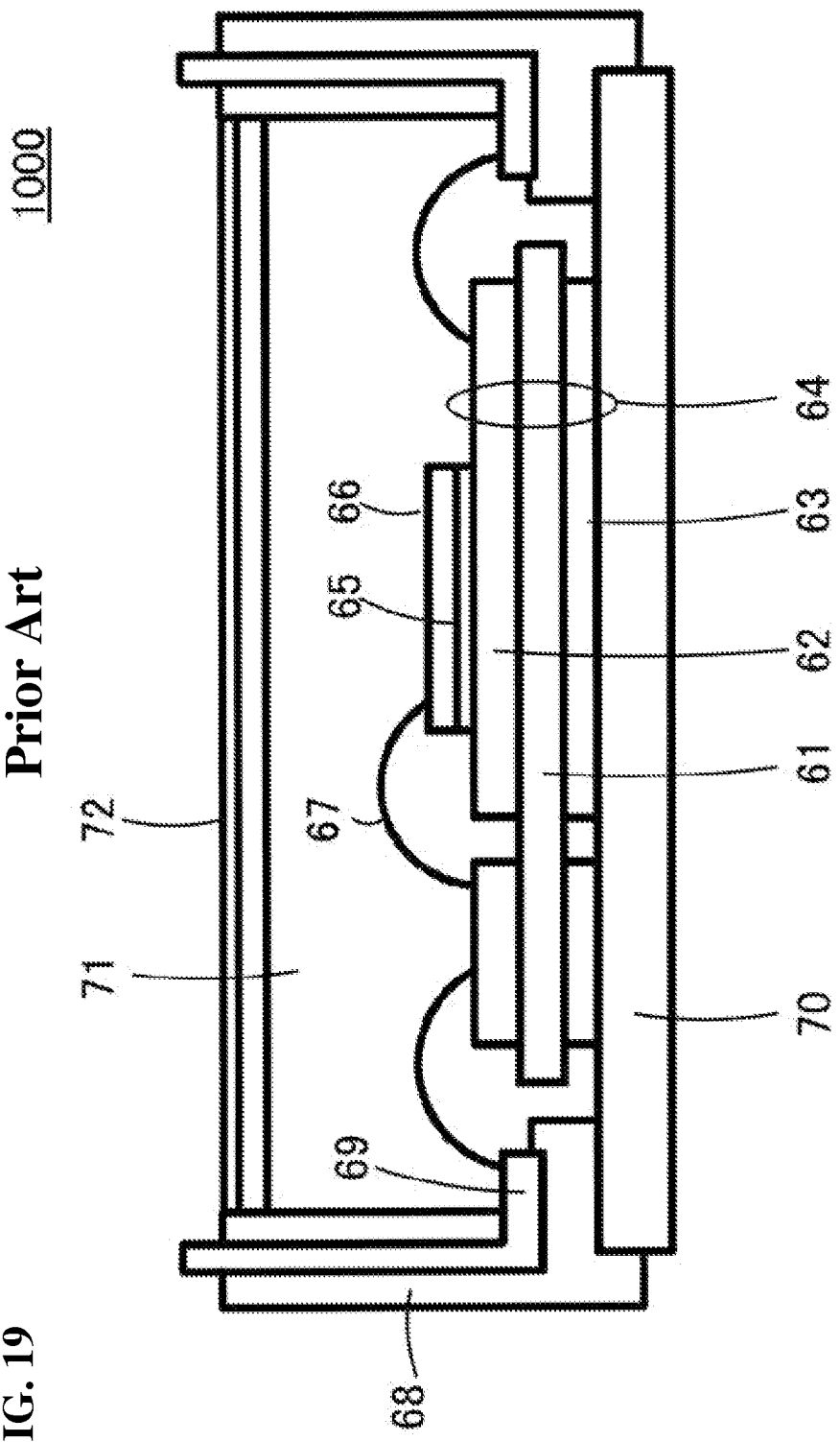
FIG. 19 is a cross-sectional view illustrating a main portion of a power semiconductor device.

In the power semiconductor device 1000 (FIG. 19), the terminal for connection to the outside is arranged in the outer circumference of the case 68. In contrast, in the power semiconductor device 100, the ends (end surfaces 7b, 8b, and 6b) of the first terminals 7 and 8 and the second terminal 6 are provided at arbitrary positions of the electrode surface 11a of the ceramic case 11. Therefore, the size of the power semiconductor device 100 is reduced and it is possible to significantly reduce a wiring length. In addition, it is possible to increase the cross-sectional area of a wire, as compared to the bonding wire 67 (FIG. 19). As a result, the inductance of the wire is reduced and it is possible to significantly reduce Joule heat generated from the wire.

Next, a method for manufacturing the ceramic case 11 will be described with reference to FIGS. 2(*a*)-2(*d*).

FIGS. 2(*a*)-2(*d*) are diagrams illustrating the method for manufacturing the ceramic case including the cavities and the terminals according to the first embodiment.

For example, the ceramic case 11 is obtained by laminating low-temperature cofired ceramic sheets (hereinafter, simply referred to as sheets), filling a predetermined opening portion with conductive paste, and performing sintering. The low-temperature cofired ceramic is a ceramic obtained by sintering glass and alumina at a low temperature of 1000° C. or less at the same time.

First, first to fifth opening portions 25 to 29 with different opening areas are formed in a plurality of (for example, four) sheets 21 to 24 (FIG. 2(*a*)). The first opening portion 25 formed in the sheet 21 and the sheet 22 becomes the first cavity 9, and the second opening portion 26 formed in the sheet 23 becomes the second cavity 10. The third to fifth opening portions 27 to 29 are filled with conductive paste 30 and become the first terminals 7 and 8 and the second terminal 6, respectively. The opening portions 25 to 29 can be formed by, for example, punching.

Figure 2A:
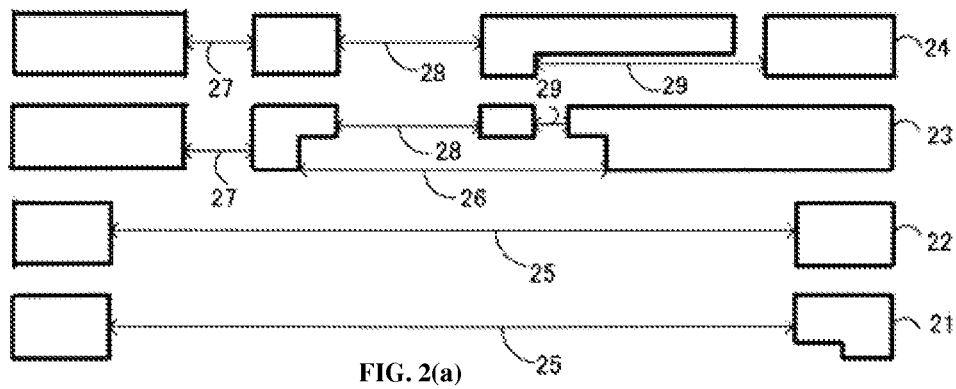
FIGS. 2(a)-2(d) are diagrams illustrating a method for manufacturing a ceramic case including a cavity and a terminal according to the first embodiment.
Figure 2B:
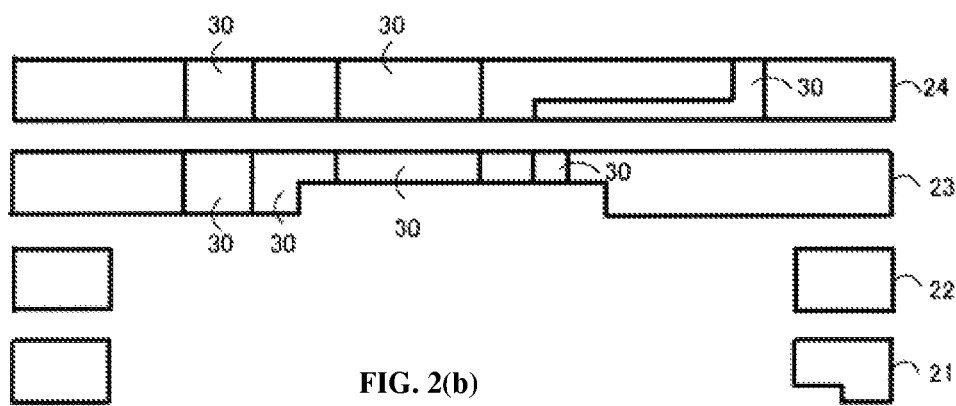
Figure 2C:
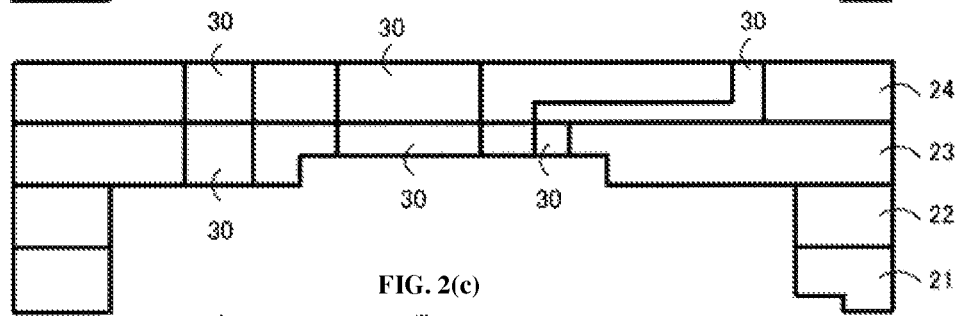

Then, the third to fifth opening portions 27 to 29 are filled with the conductive paste 30 such as copper paste or silver paste (FIG. 2(b)). In this case, for example, a printing process may be used. Then, the sheets 21 to 24 are laminated (FIG. 2(c)).

Figure 2D:
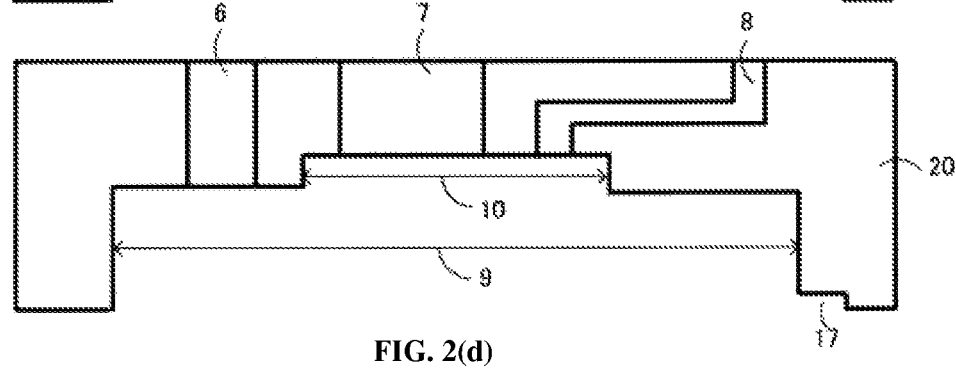

Then, the laminated sheets 21 to 24 are sintered (FIG. 2(d)). Then, the sheets are fixed to each other. At the same time, the conductive paste 30 is sintered, and the first terminals 7 and 8 and the second terminal 6 are formed. Then, the first terminals 7 and 8 and the second terminal 6 are buried. In this way, the ceramic case 11 including the first and second cavities 9 and 10 is completed.

The size or thickness of the ceramic case 11 can be arbitrarily determined. In addition, the thickness of the sheets and the number of sheets to be laminated can be changed to form the first terminals 7 and 8 and the second terminal 6 in various shapes. The thickness of the first terminal 8, which extends in the horizontal direction in the ceramic case 11, in the horizontal direction may be in the range of, for example, about 0.2 mm to 1 mm, in terms of current capacity.

Next, modifications of the power semiconductor device 100 according to the first embodiment will be described.

First Modification

Figure 3:
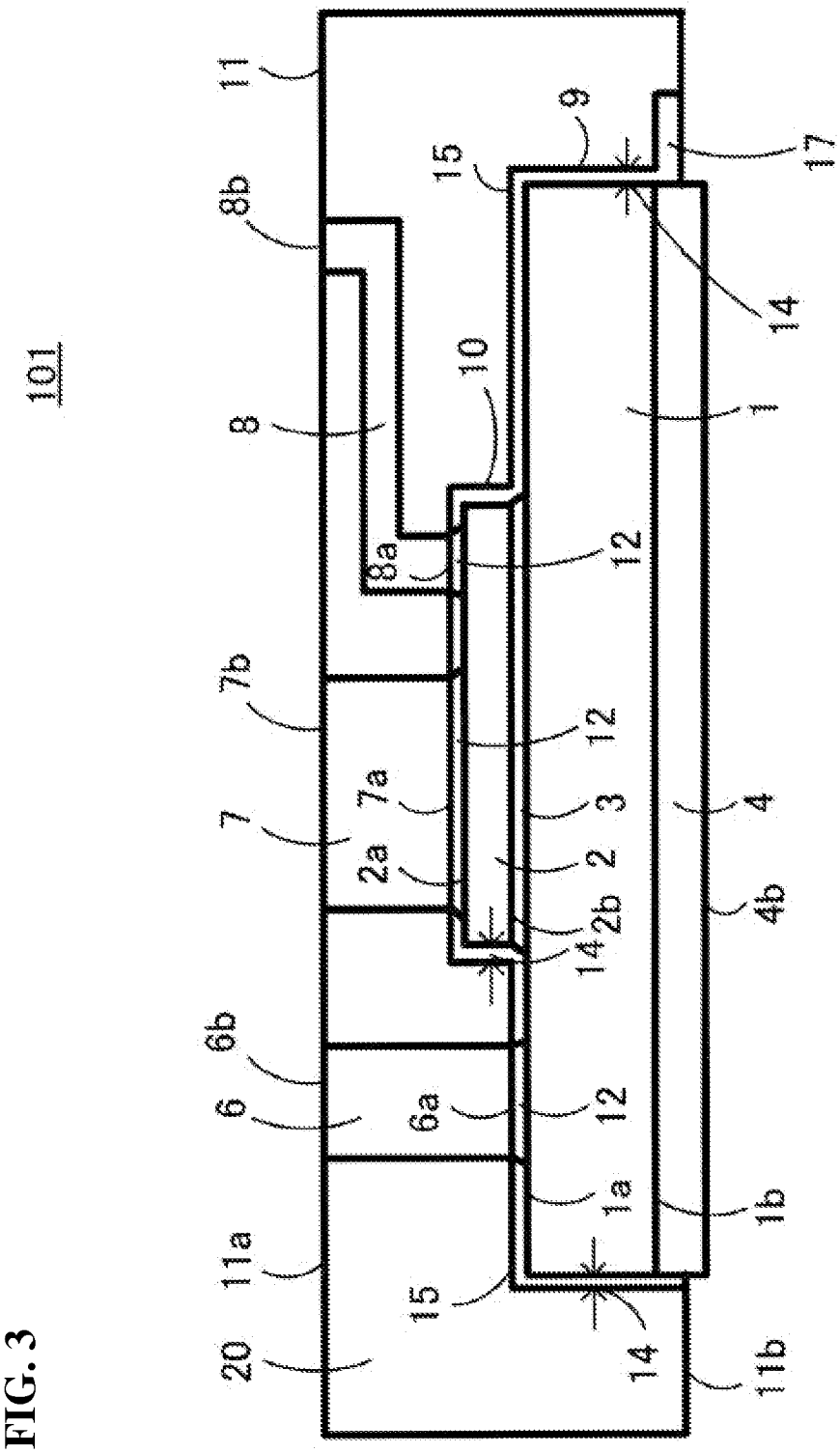
FIG. 3 is a cross-sectional view illustrating a power semiconductor device according to a first modification.

FIG. 3 is a cross-sectional view illustrating a power semiconductor device according to a first modification.

A power semiconductor device 101 differs from the power semiconductor device 100 in that a first cavity 9 is shallow and a rear surface 4b of an insulating plate 4 slightly protrudes from a ceramic case 11. The slight protrusion (for example, about 0.1 mm) makes it possible to increase the adhesion between the rear surface 4b of the insulating plate 4 and a base plate provided on the rear surface 4b and to reduce contact thermal resistance. Therefore, it is possible to improve the heat dissipation characteristics of a semiconductor chip 2.

Second Modification

Figure 4:
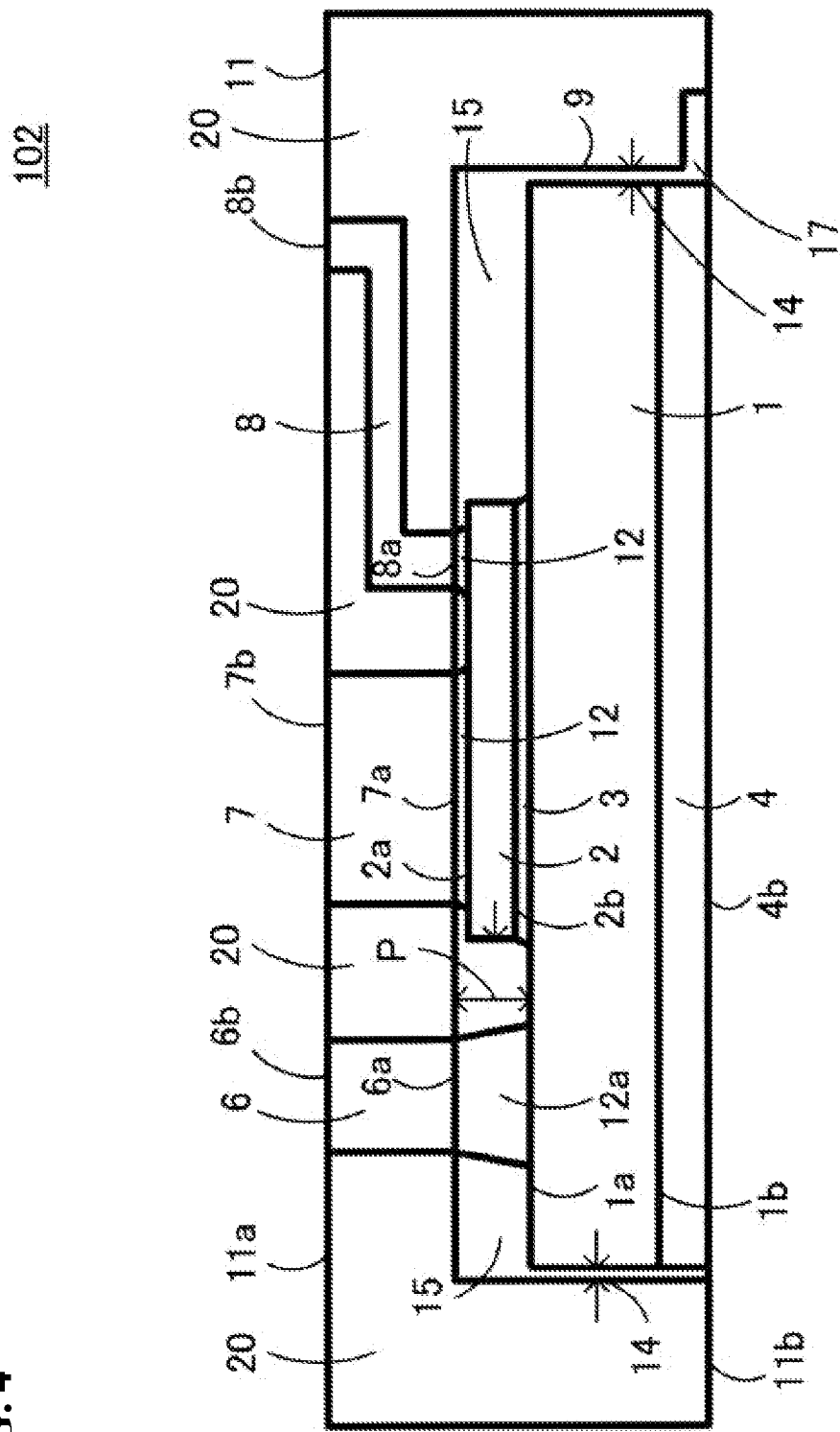
FIG. 4 is a cross-sectional view illustrating a power semiconductor device according to a second modification.

FIG. 4 is a cross-sectional view illustrating a power semiconductor device according to a second modification.

A power semiconductor device 102 differs from the power semiconductor device 100 in that the second cavity 10 is not formed and a first cavity 9 is formed deep to be a one-stage cavity. The one-stage cavity makes it possible to reduce the number of sheets used to form the cavity and thus to reduce manufacturing costs.

A semiconductor chip 2, a conductive plate 1, and an insulating plate 4 are accommodated in the first cavity 9 which is a one-stage deep cavity. Therefore, a large gap P corresponding to the thickness of the semiconductor chip 2 can be formed between a main surface 1a of the conductive plate 1 and an end surface 6a of a second terminal 6. A thick bonding material 12a may be provided in the gap or, for example, a conductive block may be separately provided in the gap.

Third Modification

Figure 5:
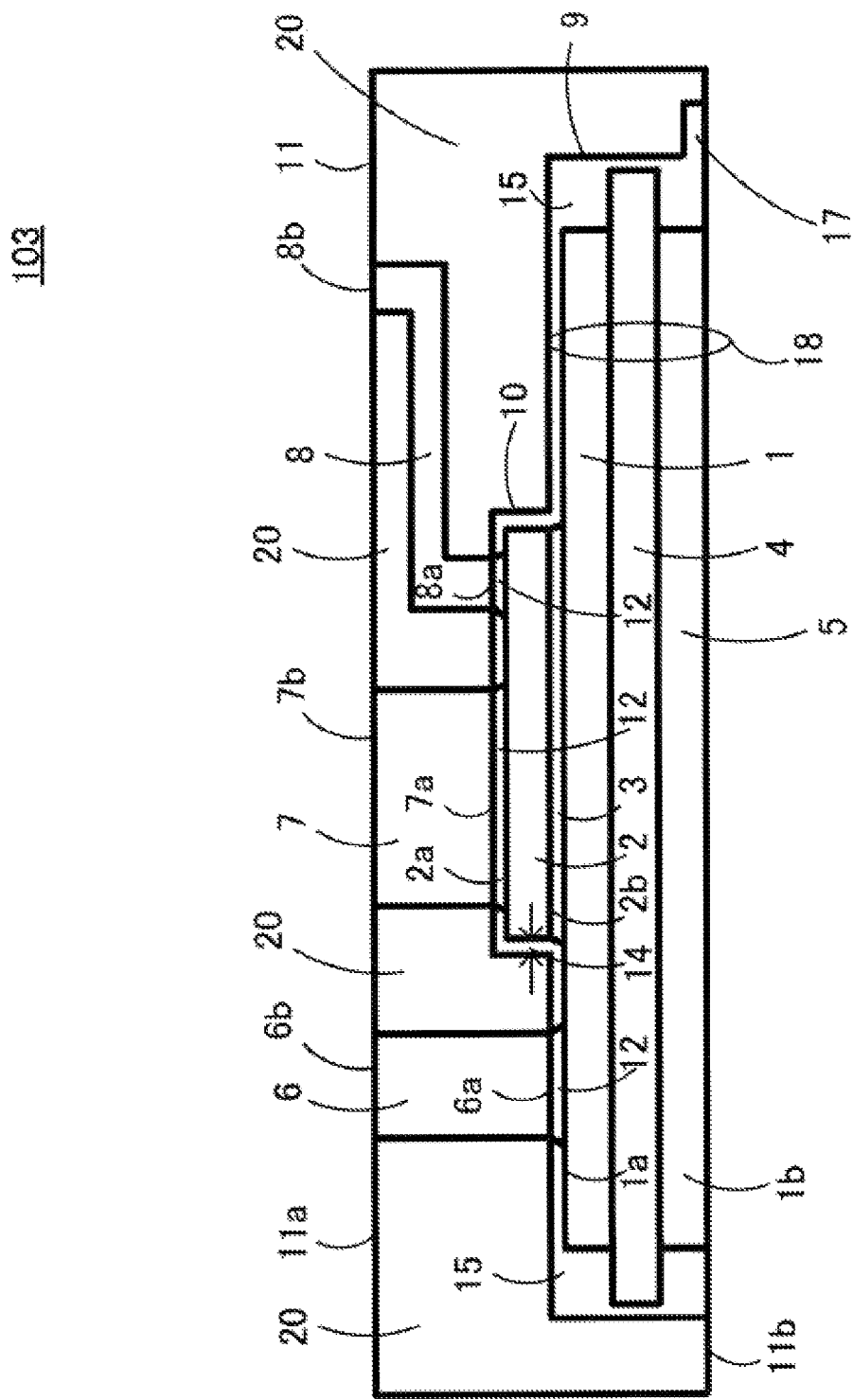
FIG. 5 is a cross-sectional view illustrating a power semiconductor device according to a third modification.

FIG. 5 is a cross-sectional view illustrating a power semiconductor device according to a third modification.

A power semiconductor device 103 differs from the power semiconductor device 100 in that a metal plate 5, such as a copper plate, is added to an insulating plate 4 in a first cavity 9. That is, a conductive plate 1, the insulating plate 4, and the metal plate 5 can be replaced with a direct copper bonding (DCB) substrate 18. The addition of the metal plate 5 makes it possible to bond the metal plate 5 and a base plate provided on the lower surface of metal plate 5 with solder. Therefore, it is possible to further reduce thermal resistance.

Second Embodiment

FIGS. 6(a) to 9 are diagrams illustrating a process of manufacturing a power semiconductor device according to a second embodiment.

First, a main surface 1a of a conductive plate 1 and a rear electrode 2b of a semiconductor chip 2 are bonded to each other by a conductive bonding material 3. In addition, an insulating plate 4 is bonded to a surface 1b of the conductive plate 1 opposite to the main surface 1a (FIG. 6(a)). A ceramic case 11 is prepared by the manufacturing method illustrated in FIGS. 2(a)-2(d) (FIG. 6(b)).

Figure 7:
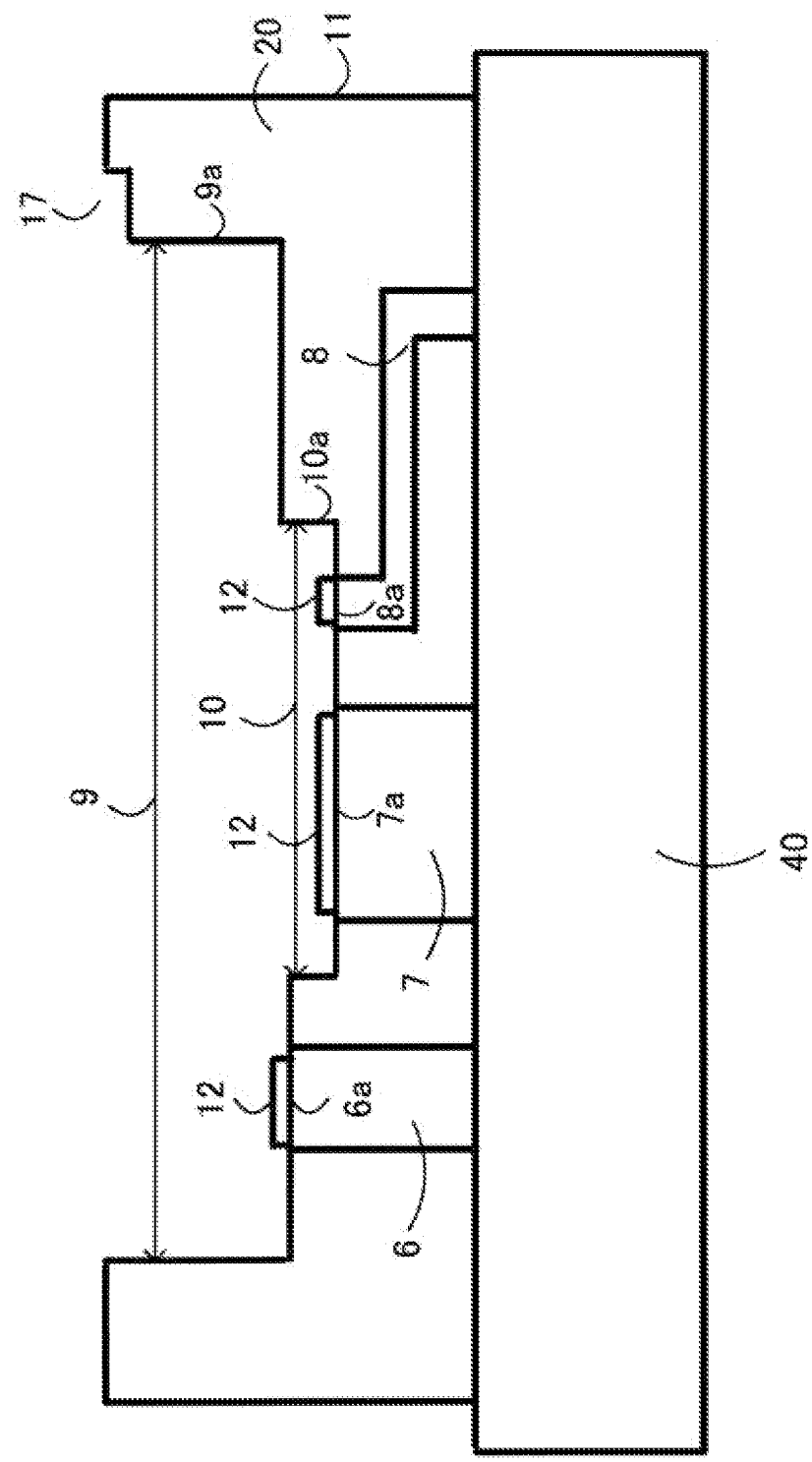
FIG. 7 is a diagram (part 2) illustrating the process of manufacturing the power semiconductor device according to the second embodiment.

Then, the ceramic case 11 is placed on a supporting table 40, with an opening portion 9a of a first cavity 9 down. Then, a bonding material 12, such as solder plate, is placed on the end surfaces 7a and 8a of first terminals 7 and 8 and the end surface 6a of a second terminal 6 which are exposed from the first and second cavities 9 and 10 (FIG. 7).

Figure 6A:
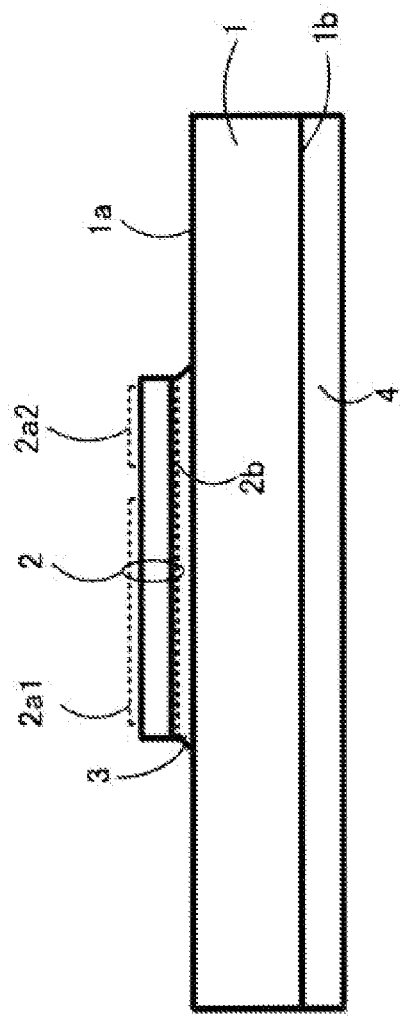
FIGS. 6(a), 6(b) are diagrams (part 1) illustrating a process of manufacturing a power semiconductor device according to a second embodiment.
Figure 6B:
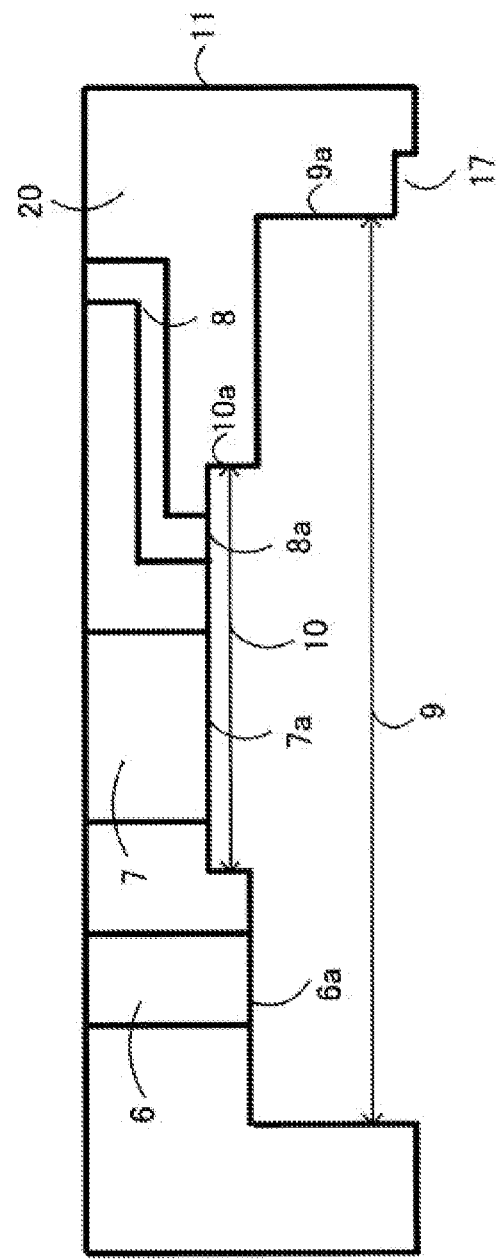
Figure 8:
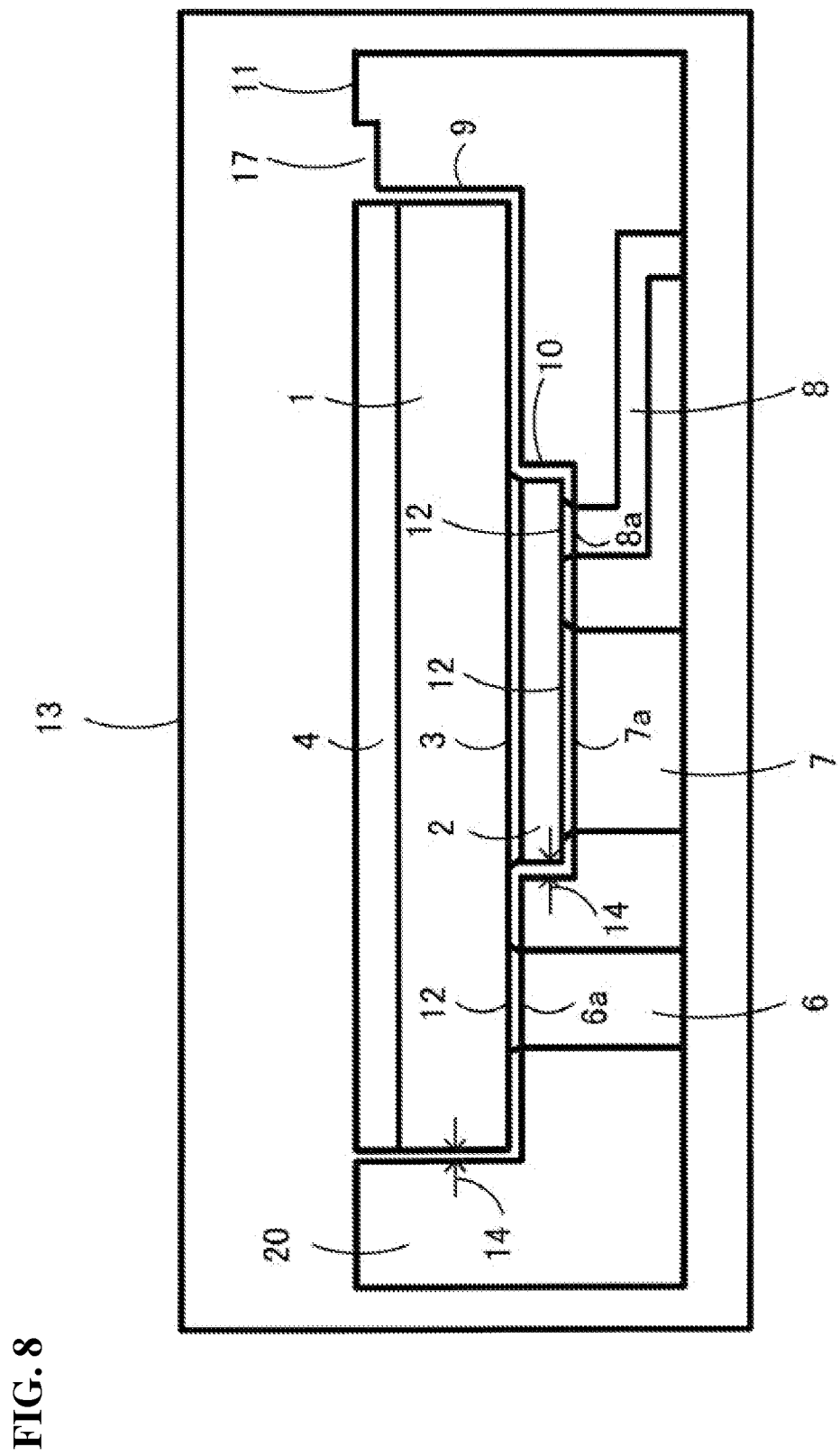
FIG. 8 is a diagram (part 3) illustrating the process of manufacturing the power semiconductor device according to the second embodiment.

Then, a unit including the semiconductor chip 2, the conductive plate 1, and the insulating plate 4 illustrated in FIG. 6(a) is turned upside down and is then fitted to the first and second cavities 9 and 10 of the ceramic case 11 (FIG. 8). At that time, the gap 14 is in the range of about 0.1 mm to 0.2 mm. In addition, at that time, the end surface 6a of the second terminal 6 contacts the main surface 1a of the conductive plate 1 through the bonding material 12. The end surfaces 7a and 8a of the first terminals 7 and 8 contact a front electrode (not illustrated) of the semiconductor chip 2 through the bonding material 12. Then, all of the above-mentioned components are put into a reflow furnace 13 and a reflow process is performed in a defoamed atmosphere to bond the contact portions with the bonding material 12.

Figure 9:
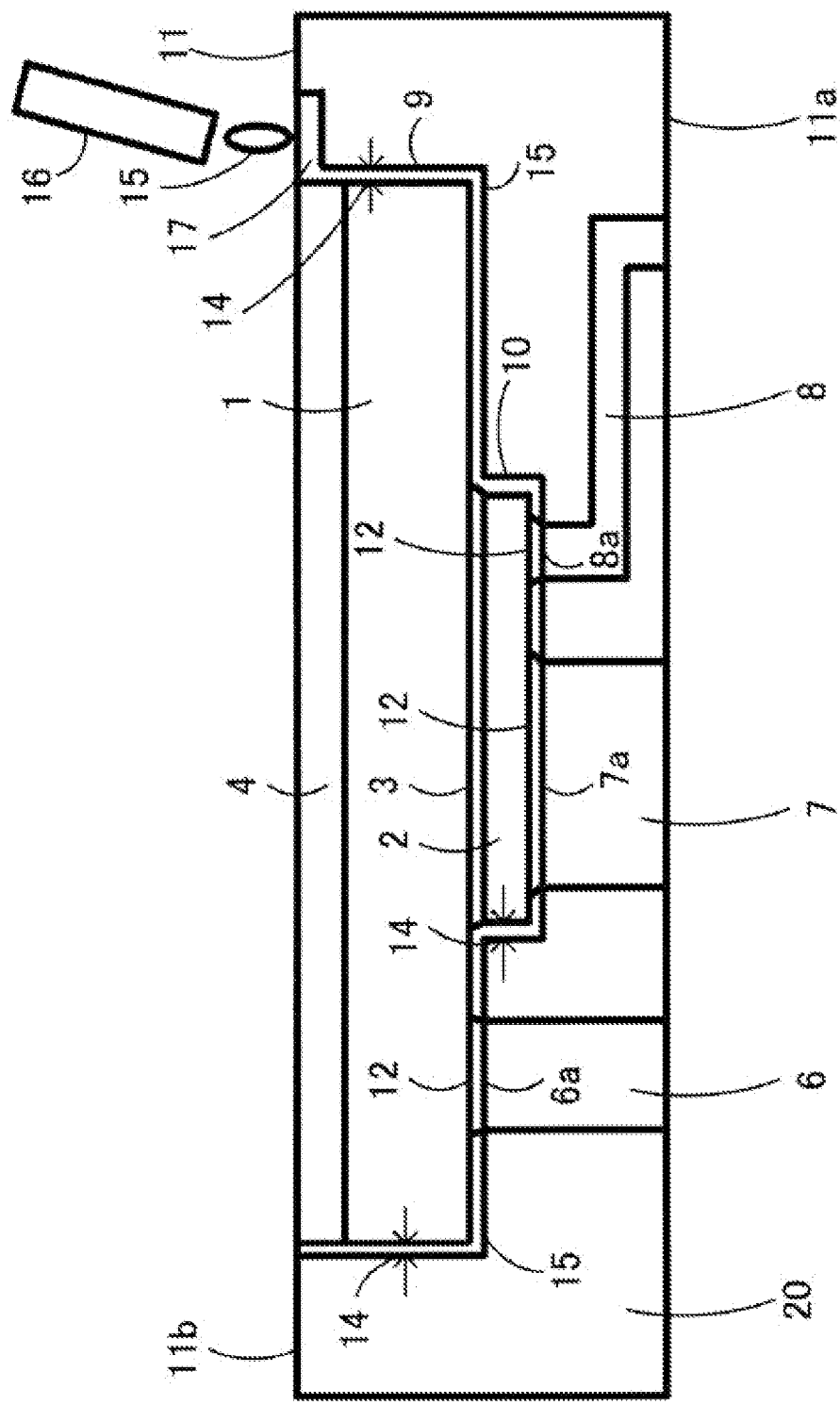
FIG. 9 is a diagram (part 4) illustrating the process of manufacturing the power semiconductor device according to the second embodiment.

Then, a dispenser 16 is used to pour a sealing material into the gap 14 between the unit and the ceramic case 11 through an inlet 17 (FIG. 9). Finally, for example, a heat treatment is performed to harden the sealing material 15 filled in the gap 14. In this way, the power semiconductor device 100 illustrated in FIGS. 1(a), 1(b) is completed.

Figure 10:
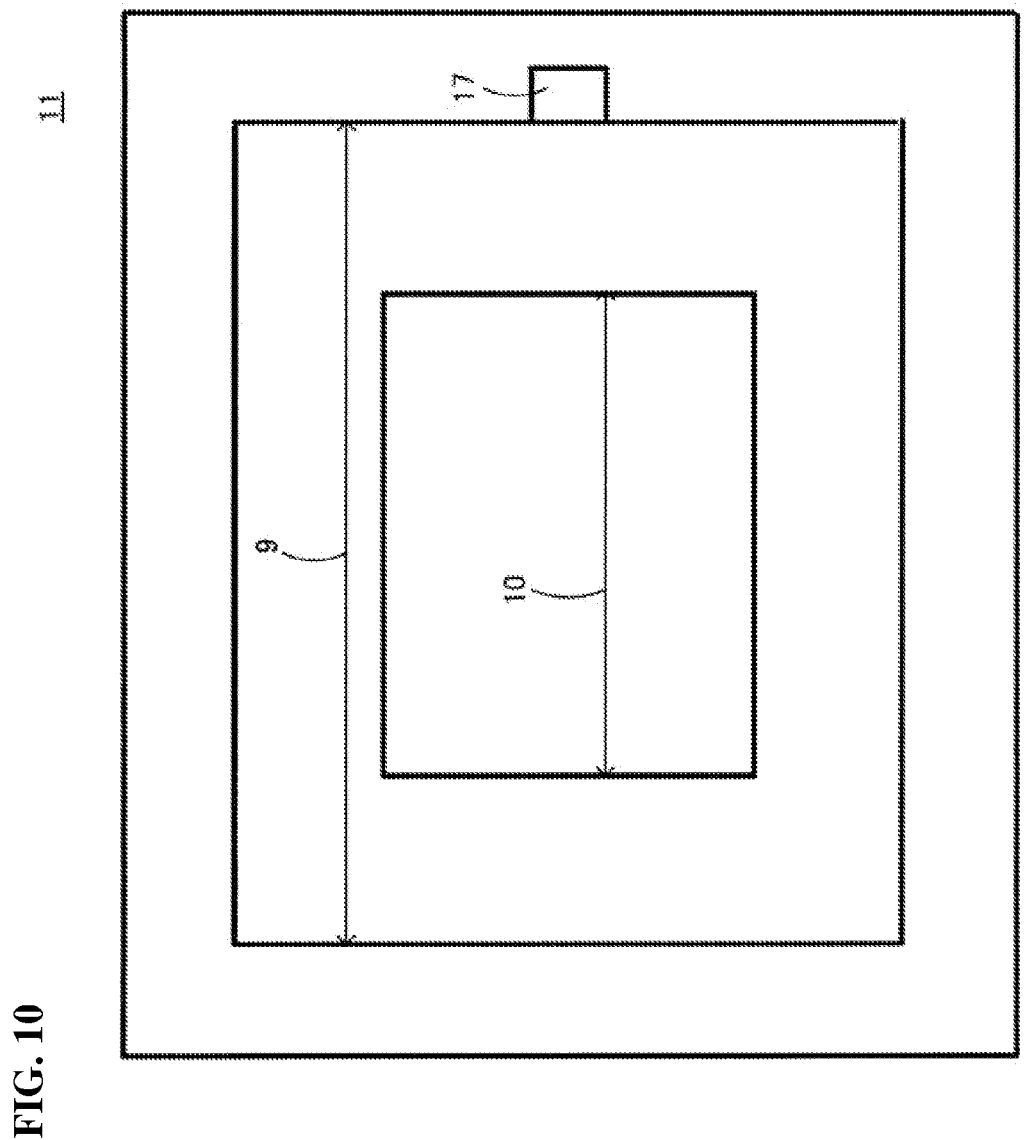
FIG. 10 is a diagram illustrating an inlet through which a sealing material is injected in the power semiconductor device according to the second embodiment.

FIG. 10 is a diagram illustrating the inlet through which the sealing material of the power semiconductor device according to the second embodiment is injected. FIG. 10 is a plan view as viewed from the bottom 11b of the ceramic case 11.

In the power semiconductor device 1000 (FIG. 19), since a large amount of Joule heat is generated, a plurality of bonding wires 67 is provided on the front electrode of the semiconductor chip 66. In contrast, in the power semiconductor device 100 according to this embodiment, it is possible to increase the cross-sectional area of the first terminals 7 and 8 and the second terminal 6. Therefore, one terminal may be provided on the front electrode 2a of the semiconductor chip 2. In this way, it is possible to simplify an assembly process. Therefore, for example, it is possible to shorten an assembly time, to improve yield, and to reduce the number of quality managers. As a result, it is possible to reduce the manufacturing costs of the power semiconductor device 100.

Third Embodiment

Figure 11:
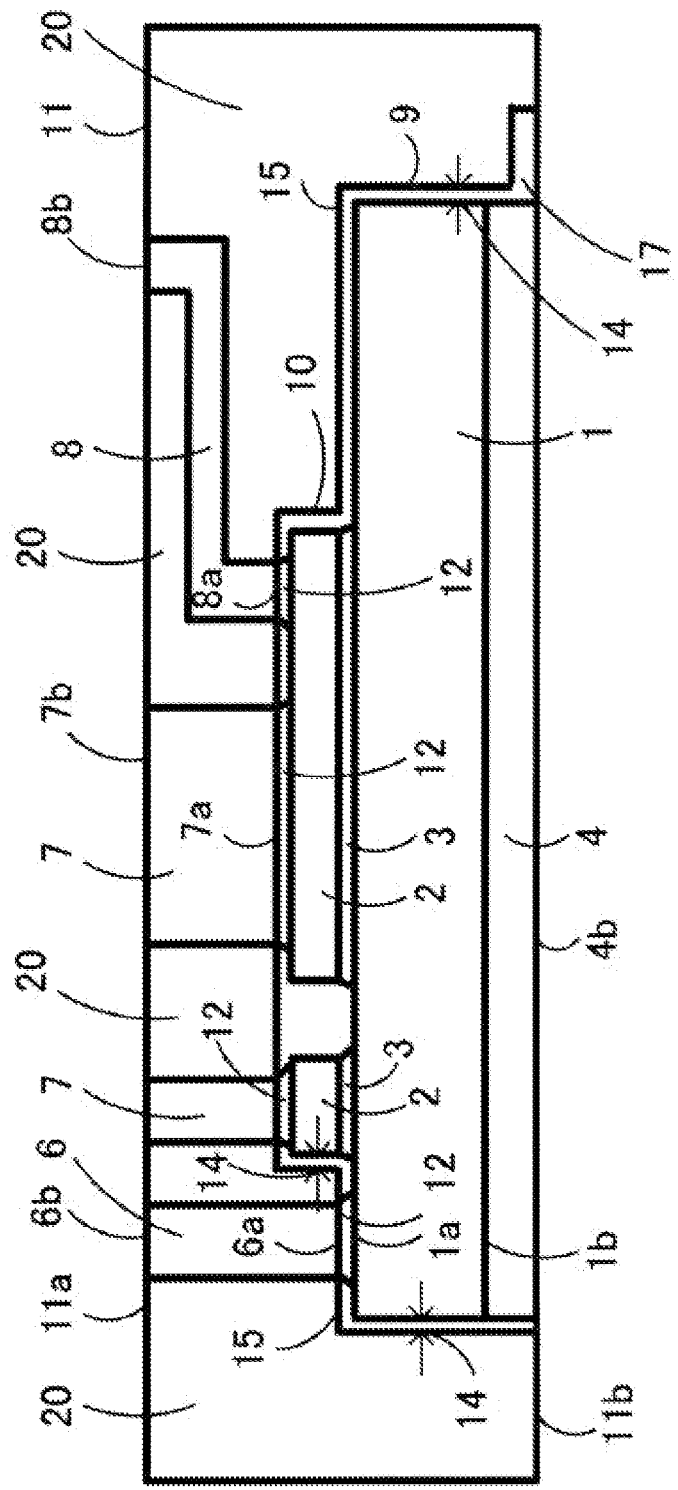
FIG. 11 is a cross-sectional view illustrating a power semiconductor device according to a third embodiment.

FIG. 11 is a cross-sectional view illustrating a power semiconductor device according to a third embodiment.

A power semiconductor device 200 differs from the power semiconductor device 100 in that two semiconductor chips 2 are fixed to one conductive plate.

The two semiconductor chips 2 are, for example, an IGBT chip and a free wheeling diode (FWD) chip. A collector electrode of the IGBT chip and a cathode electrode of the FWD chip are electrically and mechanically connected to a conductive plate 1. An emitter electrode of the IGBT chip and an anode electrode of the FWD chip are electrically and mechanically connected to one end of each of two first terminals 7 buried in a ceramic case 11. The other ends of the two first terminals 7 are electrically connected to each other to form an anti-parallel circuit of the IGBT and the FWD.

Fourth Embodiment

Figure 12:
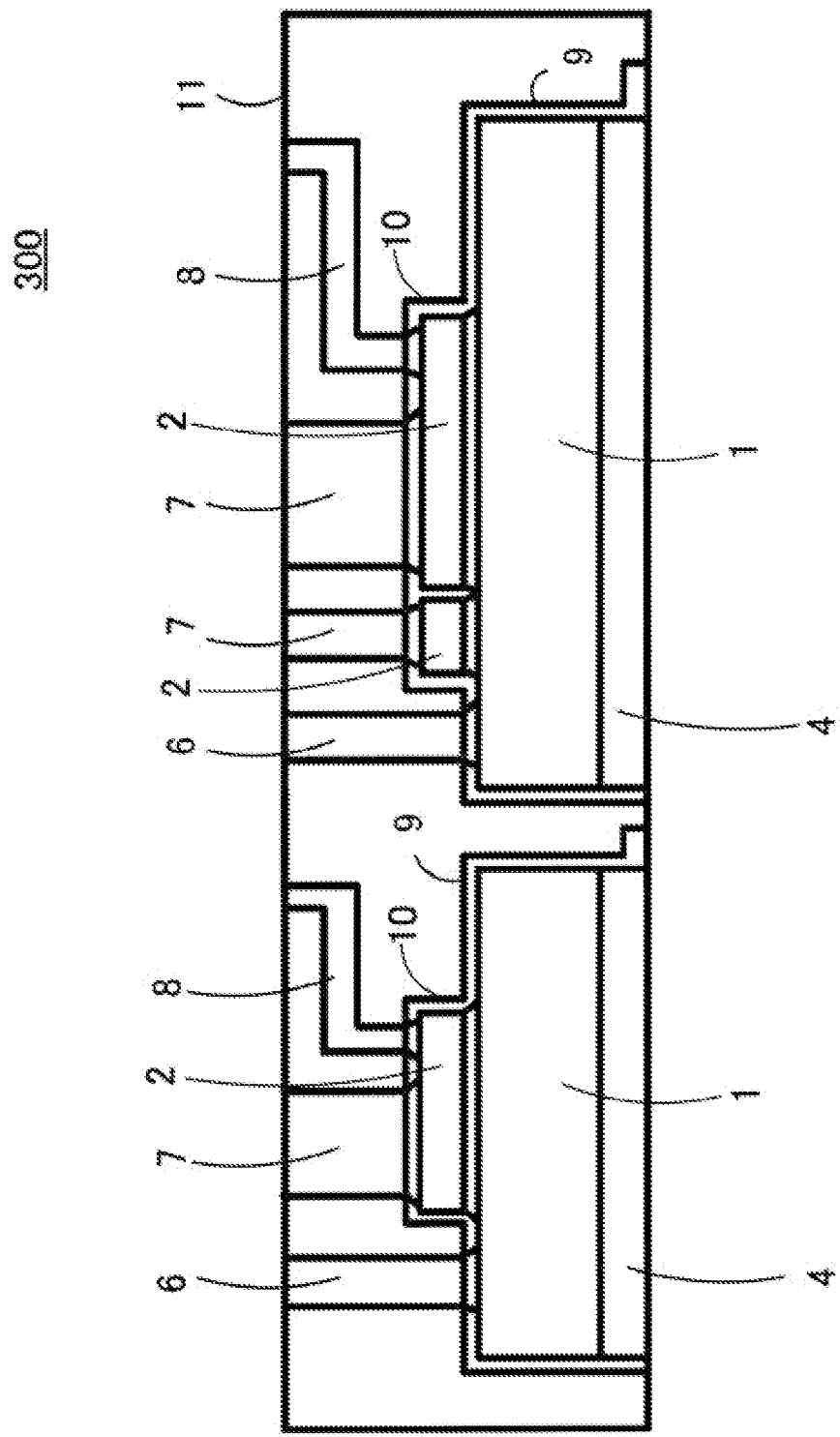
FIG. 12 is a cross-sectional view illustrating a power semiconductor device according to a fourth embodiment.

FIG. 12 is a cross-sectional view illustrating a power semiconductor device according to a fourth embodiment.

A power semiconductor device 300 includes a ceramic case 11 having two sets of first and second cavities 9 and 10 and the above-mentioned units which are accommodated in the first and second cavities 9 and 10. In this example, two sets of the first and second cavities 9 and 10 are illustrated in FIG. 12. However, the invention is not limited to this. In addition, FIG. 12 illustrates a case in which one semiconductor chip 2 is fixed to one conductive plate 1 and two semiconductor chips 2 are fixed to the other conductive plate 1.

As in this embodiment, plural sets of the first and second cavities 9 and 10 are provided in one ceramic case 11 and plural sets of units are mounted. Therefore, it is possible to provide the power semiconductor device 300 which has a small size and a complicated circuit structure at a low cost.

Fifth Embodiment

Figure 13:
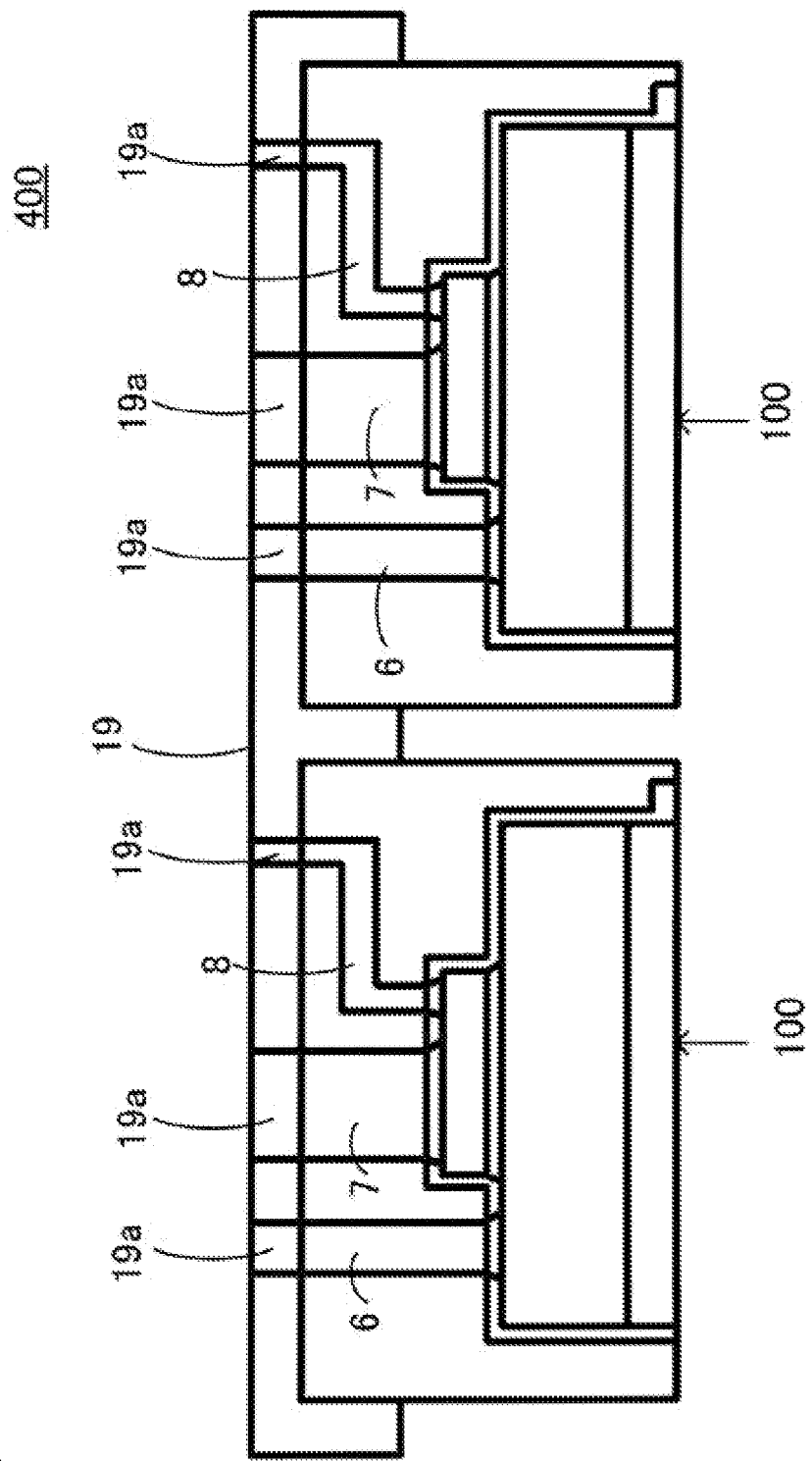
FIG. 13 is a cross-sectional view illustrating a power semiconductor device according to a fifth embodiment.

FIG. 13 is a cross-sectional view illustrating a power semiconductor device according to a fifth embodiment.

A power semiconductor device 400 is obtained by connecting the ceramic cases 11 of two power semiconductor devices 100 with an attachment 19. In the power semiconductor device 400, the two power semiconductor devices 100 are integrated with each other. A main body of the attachment 19 is an insulator. Conductors 19a which are electrically connected to the first terminals 7 and 8 and the second terminals 6 are provided in the attachment 19. In this example, two power semiconductor devices 100 are integrated with each other. However, the number of power semiconductor devices 100 to be integrated with each other is arbitrary. According to this structure, it is possible to provide the power semiconductor devices 400 with various ratings, without increasing the number of systems.

Sixth Embodiment

Figure 14:
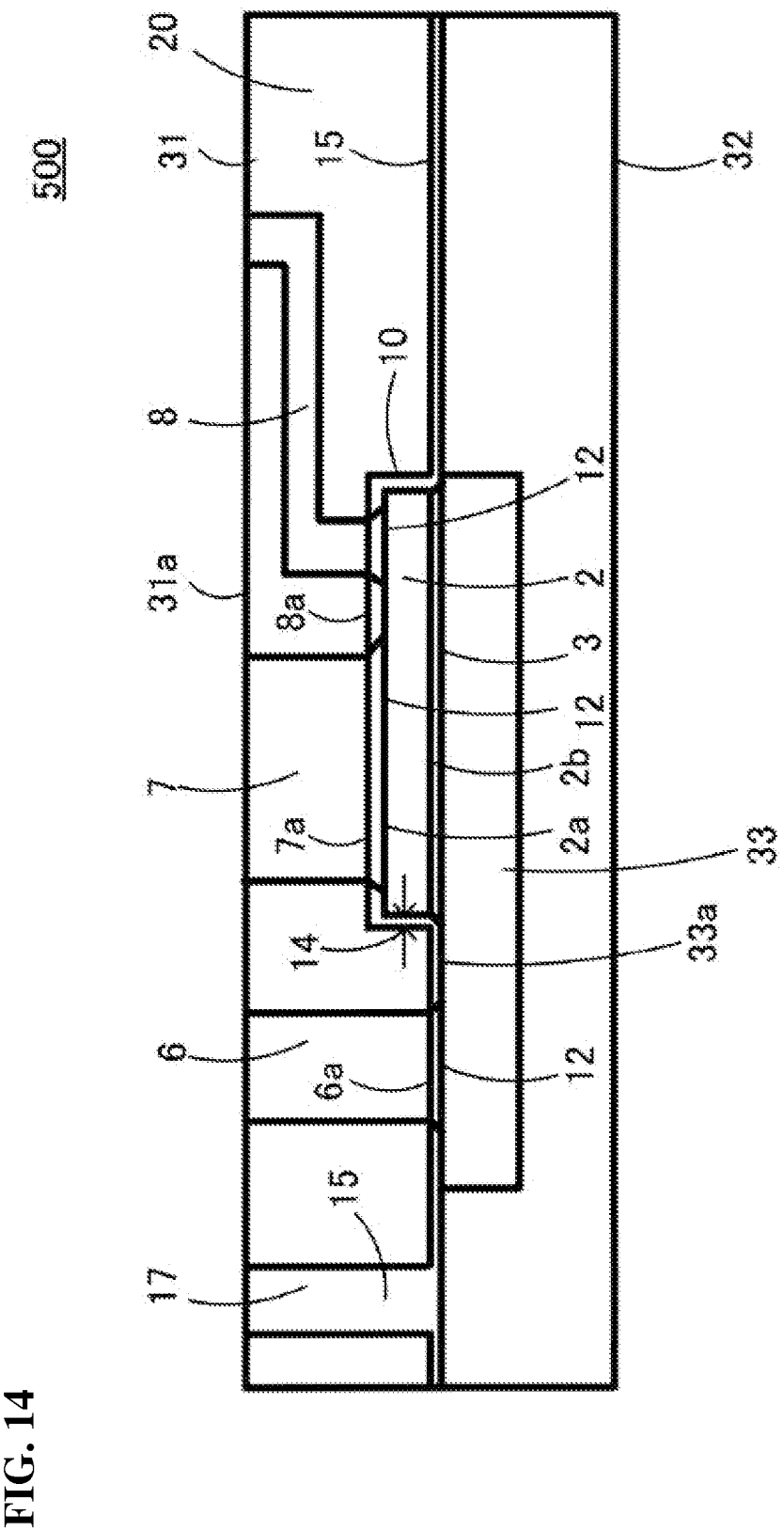
FIG. 14 is a cross-sectional view illustrating a power semiconductor device according to a sixth embodiment.

FIG. 14 is a cross-sectional view illustrating a power semiconductor device according to a sixth embodiment. In the sixth embodiment, the same members as those in the power semiconductor device 100 illustrated in FIGS. 1(a), 1(b) are denoted by the same reference numerals and the description thereof will not be repeated.

A power semiconductor device 500 includes a semiconductor chip 2, a wiring substrate 32, and a ceramic case 31. The ceramic case 31 and the wiring substrate 32 form a housing. In addition, the power semiconductor device 500 includes a sealing material 15.

The wiring substrate 32 has a conductive wiring plate 33 buried therein. A rear electrode 2b of the semiconductor chip 2 is electrically and mechanically connected to an exposure surface 33a of the wiring plate 33.

The ceramic case 31 includes ceramic 20. First terminals 7 and 8 and a second terminal 6 are buried in the ceramic case 31. In addition, the ceramic case 31 has a second cavity 10 with a concave shape. The ceramic case 31 further has an electrode surface 31a which is opposite to an opening portion of the second cavity 10.

The semiconductor chip 2 is accommodated in the second cavity 10. A sealing material 15 is provided in a gap 14 between the semiconductor chip 2 and the second cavity 10.

A front electrode 2a of the semiconductor chip 2 accommodated in the second cavity 10 is electrically and mechanically connected to one end (end surfaces 7a and 8a) of each of the first terminals 7 and 8 buried in the ceramic case 31. In addition, the other ends of the first terminals 7 and 8 are exposed from the electrode surface 31a of the ceramic case 31.

The exposure surface 33a of the wiring plate 33 is electrically and mechanically connected to one end (end surface 6a) of the second terminal 6 buried in the ceramic case 31. That is, the second terminal 6 and the rear electrode of the semiconductor chip 2 are electrically connected to each other. The other end of the second terminal 6 is exposed from the electrode surface 31a of the ceramic case 31.

The sealing material 15 is injected through an inlet 17 provided in the ceramic case 31 and fills up the gap 14. The sealing material 15 is also used to fix the ceramic case 31 and the wiring substrate 32. In addition, an adhesive different from the sealing material 15 may be used to fix the ceramic case 31 and the wiring substrate 32. The inlet 17 for the sealing material 15 may be provided in the wiring substrate 32.

As in this embodiment, when the wiring substrate 32 is used to wire the rear electrode 2b of the semiconductor chip 2, it is possible to respond to a high voltage.

Next, modifications of the power semiconductor device 500 will be described.

Fourth Modification

Figure 15:
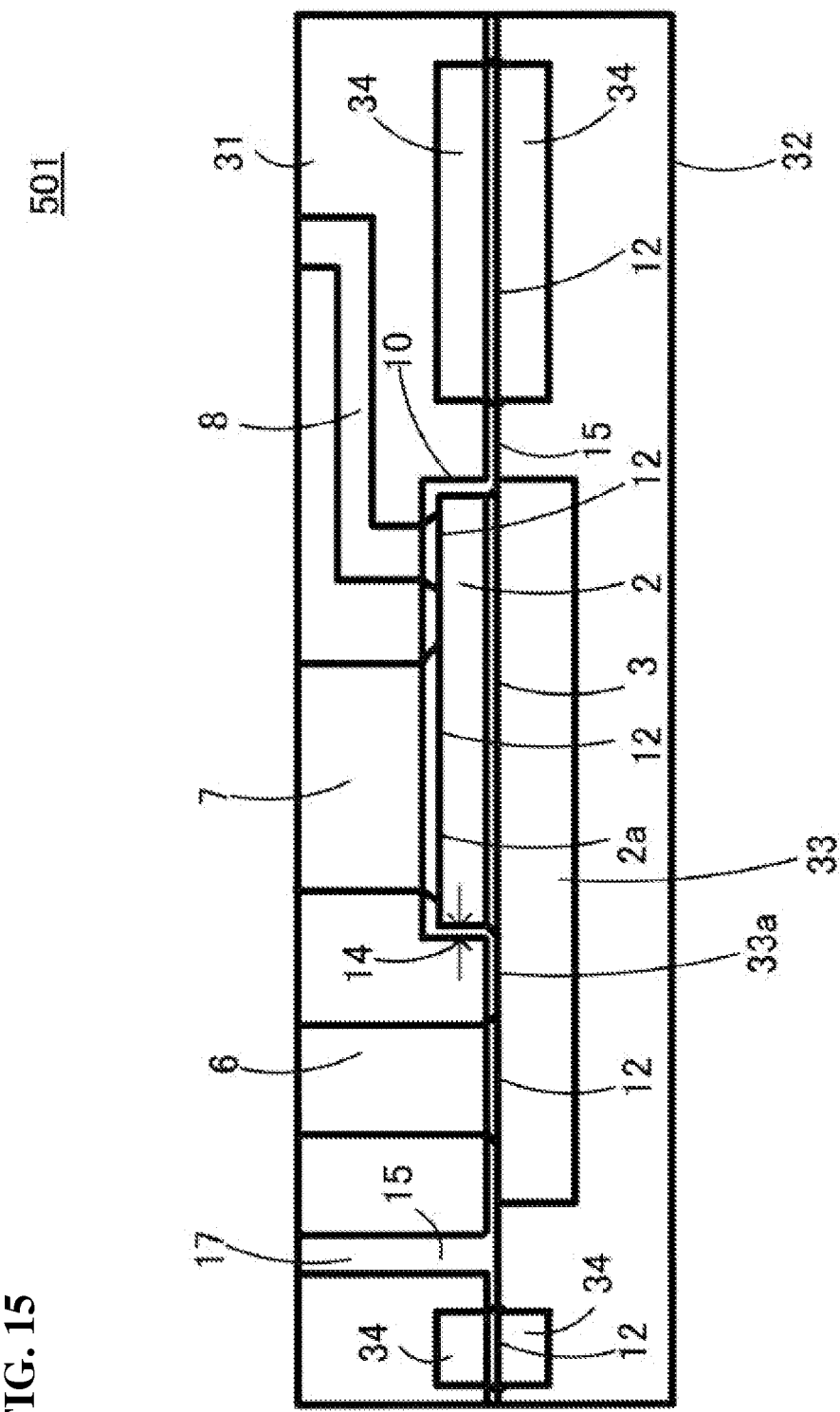
FIG. 15 is a cross-sectional view illustrating a power semiconductor device according to a fourth modification.

FIG. 15 is a cross-sectional view illustrating a power semiconductor device according to a fourth modification.

A power semiconductor device 501 differs from the power semiconductor device 500 in that dummy conductive films 34 are provided in a ceramic case 31 and a wiring substrate 32 and are bonded to each other by a bonding material 12 such as solder.

In this modification, a process of providing the dummy conductive film 34 can be performed at the same time as a process of providing the first terminals 7 and 8 and the second terminal 6 or a process of providing the wiring plate 33. In addition, the bonding material 12 can be collectively formed by the above-mentioned reflow process. Therefore, an additional process is not required. In addition, it is possible to improve the bonding strength between the ceramic case 31 and the wiring substrate 32. As a result, it is possible to improve reliability.

Fifth Modification

Figure 16:
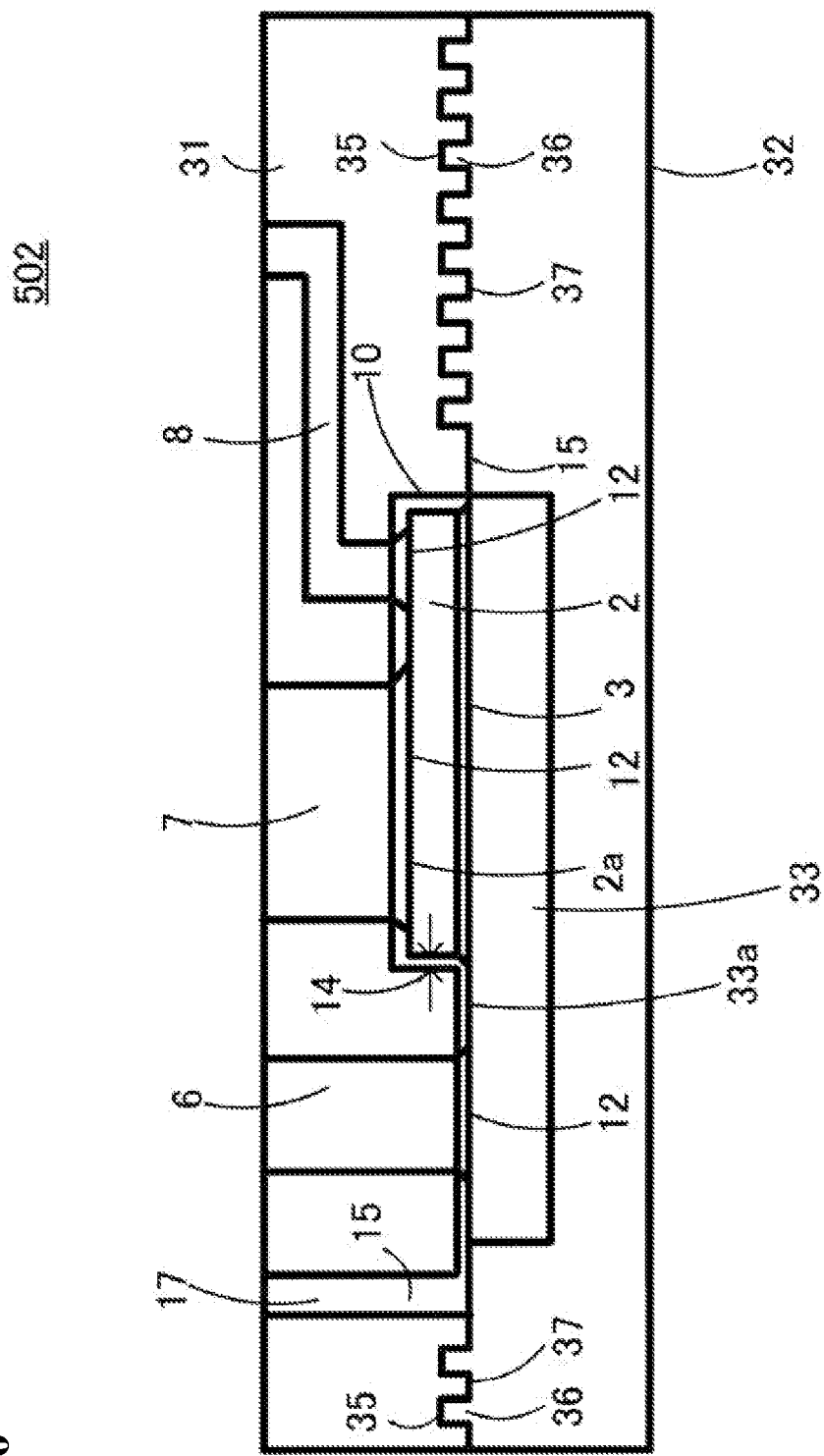
FIG. 16 is a cross-sectional view illustrating a power semiconductor device according to a fifth modification.

FIG. 16 is a cross-sectional view illustrating a power semiconductor device according to a fifth modification.

A power semiconductor device 502 differs from the power semiconductor device 500 in that a concave portion 35 is provided in a ceramic case 31, a convex portion 36 corresponding to the concave portion 35 is provided in a wiring substrate 32, and the concave portion 35 and the convex portion 36 are fitted to each other to fix the ceramic case 31 and the wiring substrate 32. For example, the concave portion 35 and the convex portion 36 are provided in a ring shape so as to surround a semiconductor chip 2. Therefore, it is possible to increase the length of an interface 37 between the ceramic case 31 and the wiring substrate 32. As a result, it is possible to improve the function of preventing the infiltration of humidity or a foreign material from the interface 37. In addition, it is possible to weaken creeping discharge at the interface 37.

Seventh Embodiment

Figure 17A:
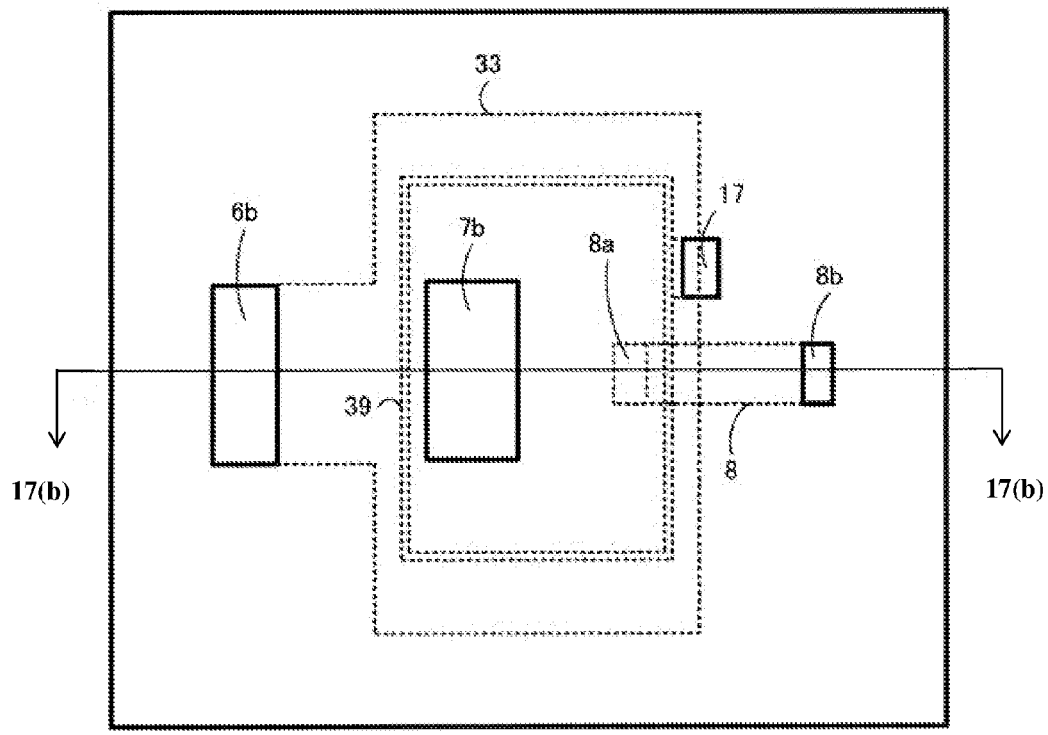
Figure 17B:
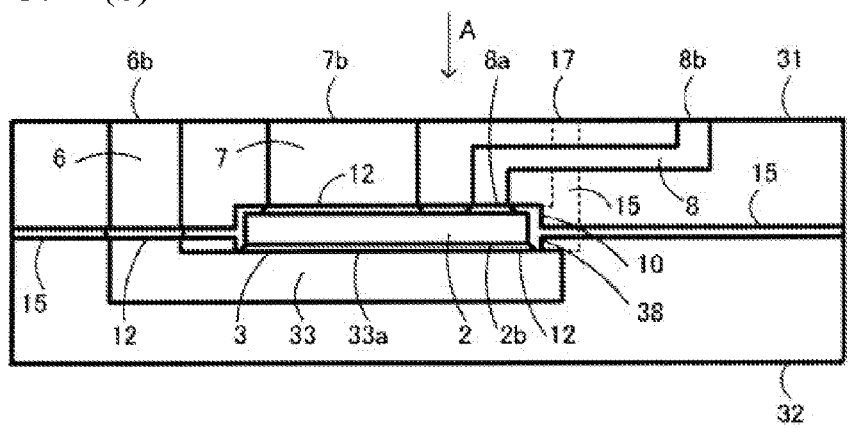

FIGS. 17(a), 17(b) are diagrams illustrating the structure of a power semiconductor device according to a seventh embodiment. FIG. 17(a) is a plan view and FIG. 17(b) is a cross-sectional view taken along the line 17(b)-17(b) of FIG. 17(a). FIG. 17(a) is a plan view as viewed from the direction of an arrow A in FIG. 17(b).

A power semiconductor device 600 includes a ceramic case 31 having a cavity 10, a wiring substrate 32 having a cavity 38, and a semiconductor chip 2 accommodated in the cavity 38 and the second cavity 10. A wiring plate 33 which is buried in the wiring substrate 32 has an exposure surface 33a which is exposed from the bottom of the cavity 38.

Eighth Embodiment

Figure 18:
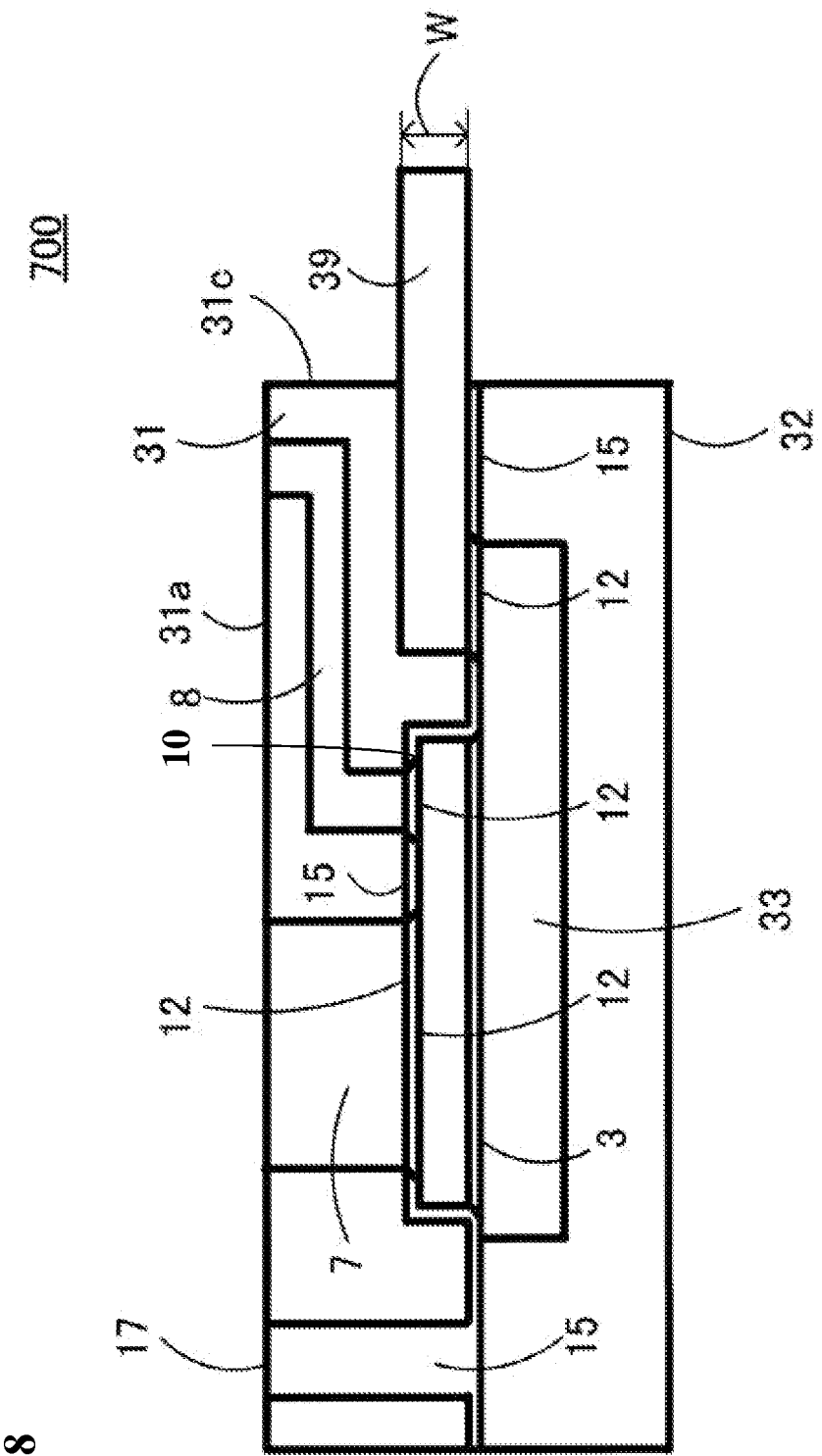
FIG. 18 is a cross-sectional view illustrating a power semiconductor device according to an eighth embodiment.

FIG. 18 is a cross-sectional view illustrating a power semiconductor device according to an eighth embodiment.

A power semiconductor device 700 differs from the power semiconductor device 500 in that a second terminal 39 is buried in the ceramic case 31 and protrudes from a side surface 31c perpendicular to an electrode surface 31a of the ceramic case 31. The second terminal 39 is electrically and mechanically connected to a wiring plate 33 of a wiring substrate 32 by a bonding material 12 such as solder.

In some cases, the protrusion of the second terminal 39 from the side surface 31c of the ceramic case 31 facilitates the assembly of a power conversion apparatus using the power semiconductor device 700. The second terminal 39 may have a thickness W of about 1 mm or more, in terms of current capacity.

Only the principle of the invention has been described above. Various modifications and changes of the invention can be made by those skilled in the art. The invention is not limited to the above-described accurate structures and applications and all of the corresponding modifications and equivalents fall within the scope of the invention defined by the appended claims and equivalents thereof.

EXPLANATIONS OF LETTERS OR NUMERALS

1 CONDUCTIVE PLATE
1a MAIN SURFACE
1b SURFACE OPPOSITE TO MAIN SURFACE
2 SEMICONDUCTOR CHIP
2a FRONT ELECTRODE
2b REAR ELECTRODE
3, 12, 12a BONDING MATERIAL
4 INSULATING PLATE
4b REAR SURFACE
5 METAL PLATE
6, 39 SECOND TERMINAL
6a, 6b, 7a, 7b, 8a, 8b END SURFACE
7, 8 FIRST TERMINAL
9 FIRST CAVITY
9a, 10a OPENING PORTION
10 SECOND CAVITY
11, 31 CERAMIC CASE
11a, 31a ELECTRODE SURFACE
11b BOTTOM
13 REFLOW FURNACE
14 GAP
15 SEALING MATERIAL
16 DISPENSER
17 INLET
18 DCB substrate
19 ATTACHMENT
19a CONDUCTOR
20 CERAMIC
21 TO 24 SHEET
25 FIRST OPENING PORTION
26 SECOND OPENING PORTION
27 THIRD OPENING PORTION
28 FOURTH OPENING PORTION
29 FIFTH OPENING PORTION
30 CONDUCTIVE PASTE
31c SIDE SURFACE
32 WIRING SUBSTRATE
33 WIRING PLATE
33a EXPOSURE SURFACE
34 DUMMY CONDUCTIVE FILM
35 CONCAVE PORTION
36 CONVEX PORTION
37 INTERFACE
38 CAVITY
40 SUPPORTING TABLE
100, 101, 102, 103, 200, 300, 400, 500, 501, 502, 600, 700 POWER SEMICONDUCTOR DEVICE

What is claimed is:

1. A semiconductor device comprising:
a semiconductor chip including a front electrode and a rear electrode;
a conductive plate having a main surface connected to the rear electrode of the semiconductor chip;
an insulating plate fixed to a surface of the conductive plate opposite to the main surface; and
a ceramic case including first and second terminals buried therein, a cavity accommodating the semiconductor chip, the conductive plate, and the insulating plate, and an electrode surface opposite to an opening portion of the cavity,
wherein the first terminal has one end connected to the front electrode of the semiconductor chip, and another end exposed from the electrode surface,
the second terminal has one end connected to the main surface of the conductive plate, and another end exposed from the electrode surface, and
the ceramic case and the insulating plate form a housing.

2. The semiconductor device according to claim 1, wherein the cavity includes a first cavity accommodating the conductive plate, and a second cavity connected to the first cavity to accommodate the semiconductor chip and having an opening portion smaller than that of the first cavity.

3. The semiconductor device according to claim 1, further comprising:
a metal plate provided on a surface of the insulating plate opposite to a surface fixed with the conductive plate.

4. The semiconductor device according to claim 1, wherein the cavity of the ceramic case includes a plurality of cavities.

5. The semiconductor device according to claim 1, wherein the ceramic case is made of a low-temperature cofired ceramic.

6. The semiconductor device according to claim 1, further comprising a sealing material to fill a gap between the semiconductor chip and the ceramic case.

7. The semiconductor device according to claim 6, wherein the sealing material is an epoxy resin.

8. The semiconductor device according to claim 1, wherein the first terminal and the second terminal have a thickness of at least 100 µm.

9. A semiconductor device comprising:
a semiconductor chip including a front electrode and a rear electrode;
a wiring substrate including a conductive wiring plate buried therein, the wiring plate having an exposure surface connected to the rear electrode of the semiconductor chip; and
a ceramic case including first and second terminals buried therein, a cavity accommodating the semiconductor chip, and an electrode surface opposite to an opening portion of the cavity,
wherein the first terminal has one end connected to the front electrode of the semiconductor chip and another end exposed from the electrode surface,
the second terminal has one end connected to the exposure surface of the wiring plate and another end exposed from the electrode surface, and
the ceramic case and the wiring substrate form a housing.

10. The semiconductor device according to claim 9, wherein a bonding surface between the ceramic case and the wiring substrate has concave and convex portions.

11. The semiconductor device according to claim 9, wherein the exposure surface of the wiring plate is provided in a bottom of the cavity provided in the wiring substrate.

12. A semiconductor device comprising:
a semiconductor chip including a front electrode and a rear electrode;
a wiring substrate including a conductive wiring plate buried therein, the wiring plate having an exposure surface connected to the rear electrode of the semiconductor chip; and
a ceramic case including first and second terminals buried therein, a cavity accommodating the semiconductor chip, and an electrode surface opposite to an opening portion of the cavity,
wherein the first terminal has one end connected to the front electrode of the semiconductor chip and another end exposed from the electrode surface,
the second terminal has one end connected to the exposure surface of the wiring plate and another end protruding from a surface perpendicular to the electrode surface, and
the ceramic case and the wiring substrate form a housing.

* * * * *